United States Patent
Ino et al.

(10) Patent No.: US 7,655,971 B2
(45) Date of Patent: Feb. 2, 2010

(54) NONVOLATILE SEMICONDUCTOR MEMORY DEVICE AND METHOD FOR MANUFACTURING THE SAME

(75) Inventors: Tsunehiro Ino, Fujisawa (JP); Kouichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 11/857,722

(22) Filed: Sep. 19, 2007

(65) Prior Publication Data

US 2008/0116507 A1    May 22, 2008

(30) Foreign Application Priority Data

Nov. 20, 2006  (JP) .............................. 2006-312895

(51) Int. Cl.
*H01L 29/792* (2006.01)
(52) U.S. Cl. ............................... 257/325; 257/E29.309
(58) Field of Classification Search ................. 257/315, 257/325, E29.129, E29.309
See application file for complete search history.

(56) References Cited

U.S. PATENT DOCUMENTS

| | | | |
|---|---|---|---|
| 5,596,214 A * | 1/1997 | Endo ............................ | 257/324 |
| 7,279,740 B2 * | 10/2007 | Bhattacharyya et al. ...... | 257/324 |
| 7,595,240 B2 * | 9/2009 | Lee et al. ...................... | 438/264 |
| 2004/0191988 A1 * | 9/2004 | Sandhu et al. ............... | 438/257 |
| 2004/0251489 A1 | 12/2004 | Jeon et al. | |
| 2005/0006696 A1 * | 1/2005 | Noguchi et al. ............. | 257/316 |
| 2005/0023603 A1 * | 2/2005 | Eldridge et al. ............. | 257/315 |

FOREIGN PATENT DOCUMENTS

| | | | |
|---|---|---|---|
| JP | 55032276 A | * | 3/1980 |
| JP | 2004-363329 | | 12/2004 |
| JP | 2005-243183 | | 9/2005 |
| JP | 2005-311379 | | 11/2005 |
| JP | 2006-203200 | | 8/2006 |
| KR | 10-20040108309 A | | 12/2004 |

OTHER PUBLICATIONS

U.S. Appl. No. 12/353,586, filed Jan. 14, 2009, Kikuchi, et al.
U.S. Appl. No. 12/193,251, filed Aug. 18, 2008, Ino.
U.S. Appl. No. 12/212,128, filed Sep. 17, 2008, Nakasaki, et al.

* cited by examiner

*Primary Examiner*—Allan R. Wilson
(74) *Attorney, Agent, or Firm*—Oblon, Spivak, McClelland, Maier & Neustadt, L.L.P.

(57) ABSTRACT

A nonvolatile semiconductor memory device includes: a source region and a drain region formed at a distance from each other in a semiconductor substrate; a tunnel insulating film formed on the semiconductor substrate between the source region and the drain region; a charge storage film formed on the tunnel insulating film; a first alumina layer formed on the charge storage film, and having a first impurity element added thereto, the first impurity element having an octacoordinate ion radius of 63 pm or greater, the first impurity element having a concentration distribution in a layer thickness direction of the first alumina layer that becomes the largest in a region close to the side of the charge storage film; a second alumina layer formed on the first alumina layer, and not having the first impurity element added thereto; and a control gate electrode formed on the second alumina layer.

12 Claims, 16 Drawing Sheets

A-A SECTION

A-A SECTION

A-A SECTION

A-A SECTION

A-A SECTION

NONVOLATILE SEMICONDUCTOR MEMORY DEVICE AND METHOD FOR MANUFACTURING THE SAME

CROSS-REFERENCE TO RELATED APPLICATION

This application is based upon and claims the benefit of priority from prior Japanese Patent Application No. 2006-312895 filed on Nov. 20, 2006 in Japan, the entire contents of which are incorporated herein by reference.

BACKGROUND OF THE INVENTION

1. Field of the Invention

The present invention relates to a nonvolatile semiconductor memory device and a method for manufacturing the nonvolatile semiconductor memory device.

2. Related Art

It has been known that flash memories are essential as high-capacity nonvolatile memory devices that enable portable telephone devices and portable music players to become smaller in size. There is a strong demand from various fields for smaller flash memories with higher capacities. Meanwhile, there are physical limitations on conventional electric insulating materials, and there is a strong demand for a novel electric insulating material with higher applicability.

It is well known that NAND-type flash memories are useful as high-capacity flash memories. As NAND-type flash memories have rapidly become small in size and high in capacity, the structure of each floating gate (FG) memory currently needs to be modified, due to problems such as the interference between neighboring cells and the difficulty in burying an insulating film between cells.

As replacements for such FG memories in the circumstances, nonvolatile semiconductor memory devices each having MONOS (Metal/Oxide film/Nitride film/Oxide film/Semiconductor) memory cells have been suggested (see JP-A 2004-363329 (KOKAI), for example). Each of such MONOS memory cells has a gate stack structure formed on the channel existing between the source/drain diffusion layers on a Si substrate. This gate stack structure includes a tunnel insulating film for letting write/erase charges pass, a silicon nitride film that functions as a charge storage layer, a silicon oxide film or an aluminum oxide film as an insulating film that serves to block a current, and a gate electrode. With such a gate stack structure, the above described problems with FG memory cells can be easily solved.

Meanwhile, studies on high-dielectric gate insulating films have been continued as the device size has become smaller. Especially, hafnium silicate (HfSiO) is considered to have great potential, and is being studied all over the world. For example, JP-A 2006-203200 (KOKAI) discloses the results of studies on hafnium silicate and an example method for preventing a decrease in device reliability due to crystallization. Although JP-A 2006-203200 (KOKAI) teaches the process of replacing silicon with aluminum, a composite oxide containing aluminum (aluminate) differs from a composite oxide containing silicon (silicate) in the valence and crystalline structure. For example, Si is a tetravalent element, and Al is a trivalent element. $SiO_2$ as the base of silicate has an α-quartz structure, while $Al_2O_3$ as the base of aluminate has a corundum structure or a γ-alumina structure.

However, with a nonvolatile semiconductor memory device including MONOS memory cells, there is a concern about a decrease of the trapping efficiency with which charges are trapped into the charge storage film at the time of writing, since the charge storage film has become thinner as the device size has become smaller.

SUMMARY OF THE INVENTION

The present invention has been made in view of these circumstances, and an object thereof is to provide a nonvolatile semiconductor memory device that includes MONOS memory cells having the highest possible charge trapping efficiency. Another object of the present invention is to provide a method for manufacturing such a semiconductor device.

A nonvolatile semiconductor memory device according to a first aspect of the present invention includes a memory cell, the memory cell including: a source region and a drain region formed at a distance from each other in a semiconductor substrate; a tunnel insulating film formed on the semiconductor substrate between the source region and the drain region; a charge storage film formed on the tunnel insulating film; a first alumina layer formed on the charge storage film, and having a first impurity element added thereto, the first impurity element having an octacoordinate ion radius of 63 pm or greater, the first impurity element having a concentration distribution in a layer thickness direction of the first alumina layer that becomes the largest in a region close to the side of the charge storage film; a second alumina layer formed on the first alumina layer, and not having the first impurity element added thereto; and a control gate electrode formed on the second alumina layer.

A nonvolatile semiconductor memory device according to a second aspect of the present invention includes a memory cell, the memory cell including: a source region and a drain region formed at a distance from each other in a semiconductor substrate; a tunnel insulating film formed on the semiconductor substrate between the source region and the drain region; a charge storage film formed on the tunnel insulating film; a control gate electrode formed above the charge storage film; and an alumina film formed between the charge storage film and the control gate electrode, and including a transition alumina layer provided on the side of the charge storage film and an α-phase alumina layer provided on the side of the control gate electrode.

A nonvolatile semiconductor memory device according to a third aspect of the present invention includes a memory cell, the memory cell including: a source region and a drain region formed at a distance from each other in a semiconductor substrate; a tunnel insulating film formed on the semiconductor substrate between the source region and the drain region; a charge storage film formed on the tunnel insulating film; a block insulating film formed on the charge storage film, and including an alumina film having an impurity element added thereto, the impurity element having an octacoordinate ion radius that is greater than 53 pm but smaller than 63 pm; and a control gate electrode formed on the alumina film.

A nonvolatile semiconductor memory device according to a fourth aspect of the present invention includes a memory cell, the memory cell including: a source region and a drain region formed at a distance from each other in a semiconductor substrate; a tunnel insulating film formed on the semiconductor substrate between the source region and the drain region; a charge storage film formed on the tunnel insulating film, and including an alumina film having an impurity element added thereto, the impurity element having an octacoordinate ion radius that is equal to or greater than 63 pm; a block insulating film formed on the charge storage film; and a control gate electrode formed on the block insulating film.

A method for manufacturing a nonvolatile semiconductor memory device according to a fifth aspect of the present invention includes: forming a tunnel insulating film on a semiconductor substrate; forming a charge storage film on the tunnel insulating film; forming an alumina film on the charge storage film; adding a first impurity element into a region in the alumina film on the side of the charge storage film, the first impurity element having an octacoordinate ion radius of 63 pm or greater; and forming a transition alumina layer in a region in the alumina film on the side of the charge storage film by carrying out heat treatment at a temperature ranging from 950 to 1100° C., and forming an α-phase alumina layer in a region in the alumina film on the opposite side from the charge storage film.

The above method may further include adding a second impurity element into a region in the alumina film on the opposite side from the charge storage film prior to the heat treatment, the second impurity element having an octacoordinate ion radius that is greater than 53 pm but smaller than 63 pm.

DETAILED DESCRIPTION OF THE INVENTION

The following is a description of embodiments of the present invention, with reference to the accompanying drawings.

First Embodiment

Figure 1:
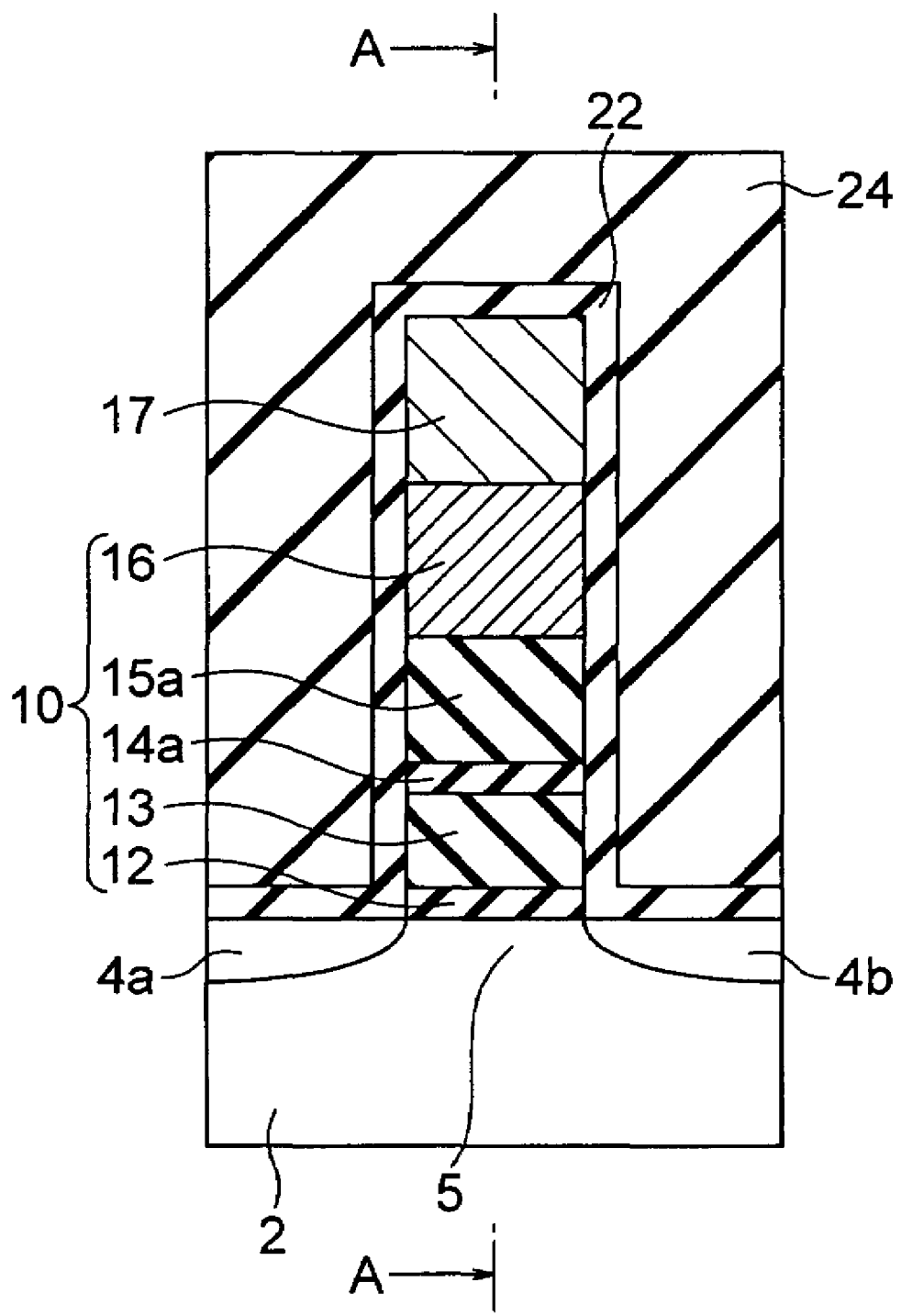
FIG. 1 is a column-direction cross-sectional view of a memory cell of a NAND-type MONOS flash memory according to a first embodiment.
Figure 2:
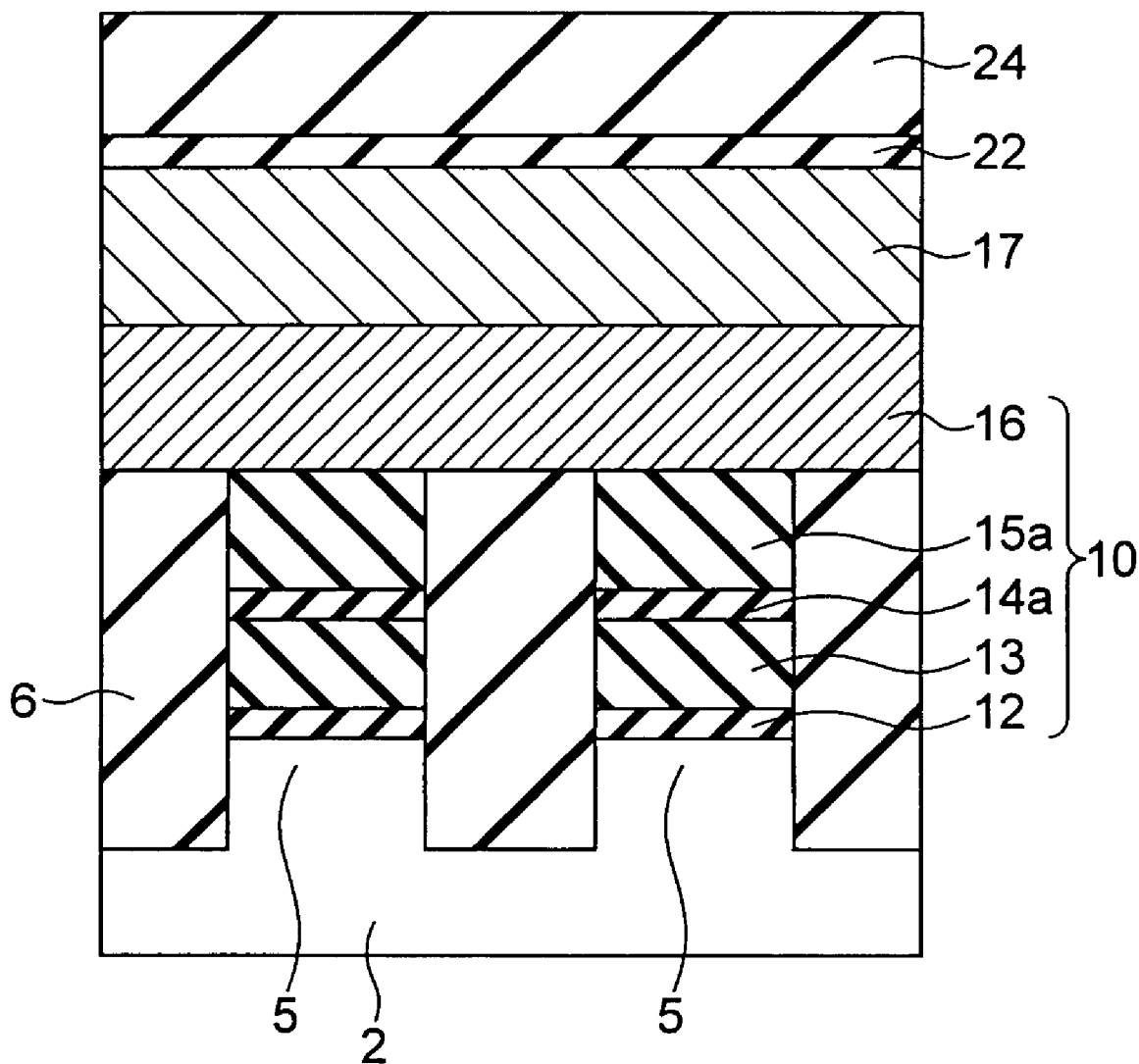
FIG. 2 is a row-direction cross-sectional view of a memory cell of the NAND-type MONOS flash memory of the first embodiment, taken along the line A-A of FIG. 1.

FIGS. 1 and 2 illustrate a nonvolatile semiconductor memory device in accordance with a first embodiment of the present invention. The nonvolatile semiconductor memory device of this embodiment is a MONOS flash memory of a NAND type having memory cells of a MONOS (Metal-Oxide-Nitride-Oxide-Semiconductor) structure. In this embodiment, a flat-type cell structure that has an insulating film isolating the memory cells from one another, so as to prevent an increase in interference between neighboring memory cells even if the memory cells are miniaturized. Here, the insulating film is a silicon oxide film or the like preferably having low permittivity.

The nonvolatile semiconductor memory device of this embodiment has a NAND cell including memory cells that are connected in series. Each of the memory cells includes a source region 4a and a drain region 4b formed at a distance from each other so as to face a semiconductor substrate 2 (or a well), and a gate 10 of a stack structure formed on the region of the semiconductor region serving as a channel 5 located between the source region 4a and the drain region 4b. This gate 10 has a structure in which a tunnel insulating film 12, a charge storage film 13, an $Al_2O_3$ film 14a of a transition alumina structure of the θ phase, δ phase, or γ phase, an $Al_2O_3$ film 15a of the α phase, and a control gate electrode film 16 are stacked in this order on the channel 5. Word lines 17 are provided to be connected to the control gate electrode films 16 of the memory cells of the NAND cell. In each memory cell, the side faces of the gate 10 and the upper face and the side faces of the word line 17 are covered with an insulating film 22. The gates 10 of the memory cells of the NAND cell are isolated from one another by insulating films 6, as shown in FIG. 2. Each memory cell is covered with an interlayer insulating film 24. FIG. 2 is a cross-sectional view of a memory cell, taken along a line extending in the row direction or in the extending direction of the word lines 17. FIG. 1 is a cross-sectional view of a memory cell, taken along a line extending in the column direction perpendicular to the row direction.

Referring now to FIGS. 3 through 8B, a method for manufacturing the nonvolatile semiconductor memory device of this embodiment is described.

First, a natural oxide film is removed by subjecting the silicon substrate 2 to diluted hydrofluoric acid treatment, with the (001) plane of silicon single crystals being exposed. A 4-nm thick $SiO_2$ film, for example, is formed as the tunnel insulating film 12 on the silicon substrate 2 (see FIG. 3). The film is generally formed by performing thermal oxidation on the silicon substrate. The tunnel insulating film 12 is not limited to a $SiO_2$ film, but may be a SiON film. If a SiON film is employed, a SiN film may be formed by CVD (Chemical Vapor Deposition) or the like, followed by oxidation, or a $SiO_2$ film may be nitrided. The tunnel insulating film 12 may also be a high-dielectric film (a high-k film) such as a HfSiON film, a HfAlO film, or a LaAlO film. In such a case, the film may be formed by CVD or PVD (Physical Vapor Deposition). Various kinds of heat treatment may be carried out after the film formation of the tunnel insulating film 12, or any heat treatment may not be carried out.

Figure 3:
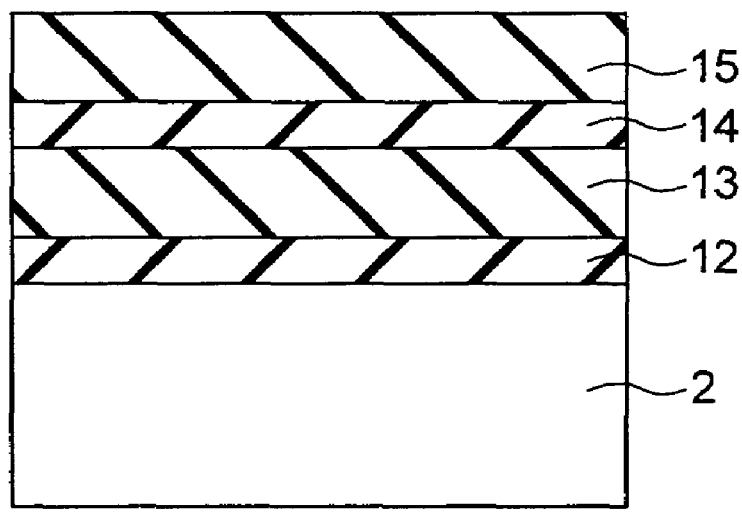
FIG. 3 is a cross-sectional view illustrating a process for manufacturing the NAND-type MONOS flash memory according to the first embodiment.
Figure 4:
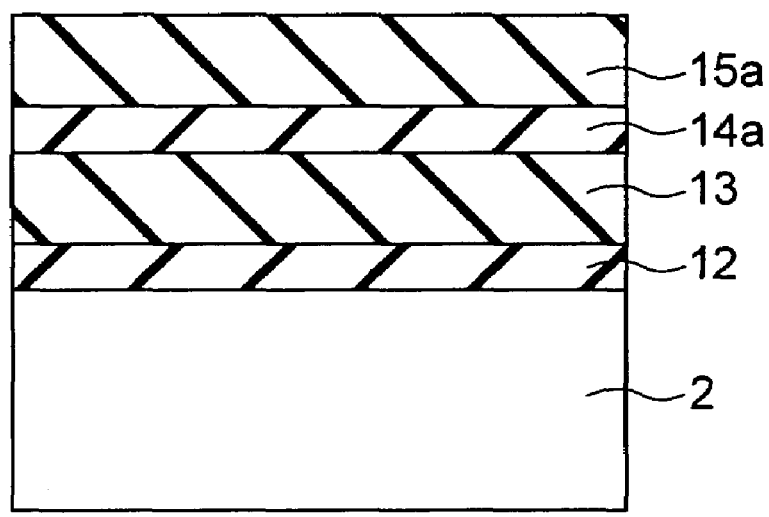
FIG. 4 is a cross-sectional view illustrating a process for manufacturing the NAND-type MONOS flash memory according to the first embodiment.

A 7-nm thick SiN film is then formed as the charge storage film 13 on the tunnel insulating film 12 (see FIG. 3). The film may be formed by CVD, ALD (Atomic Layer Deposition), or PVD. Various kinds of heat treatment may be carried out after the film formation of the charge storage film 13, or any heat treatment may not be carried out. In this embodiment, the charge storage film 13 is a silicon nitride film. However, the charge storage film 13 may be a silicon oxynitride film, a germanium nitride film, a germanium oxynitride film, a gallium nitride film, a gallium oxynitride film, an aluminum nitride film, an aluminum oxynitride film, a titanium nitride film, or a titanium oxynitride film, or a compound or a mixed material of those films.

A 1-nm thick $Al_2O_3$ film 14 having Pr as a first impurity element added thereto is formed on the charge storage film 13. The film may be formed by CVD, ALD, a technique involving CVD, or PVD. It is also possible to form an Al film having Pr added thereto, and let the Al film be oxidized in the later film forming procedures.

Other than Pr, the first impurity element added to the $Al_2O_3$ film 14 may be one or more of the following elements: La, Ce, Nd, Sm, Eu, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu. The common feature among those elements is that the octacoordinate ion radius is 63 pm or more, which is at least 1.19 times greater than the octacoordinate ion radius of Al, which is cations. However, N and S are anions, but N and S are selected, each having an octacoordinate ion radius at least 1.06 times greater than the tetracoordinate ion radius of O, which are anions.

A 10-nm thick $Al_2O_3$ film 15 is then formed on the $Al_2O_3$ film 14 having Pr added thereto (see FIG. 3). The film may be formed by CVD, ALD, a technique involving CVD, or PVD. No elements may be added to the $Al_2O_3$ film 15, or Ga may be added as a second impurity element to the $Al_2O_3$ film 15. Other than Ga, the second impurity element may be one or more elements selected from the group of Co, Ni, Fe, Cr, Mn, and Be. The common feature among those elements is that the octacoordinate ion radius is greater than 53 pm but smaller than 63 pm. Although an oxide of Be, which is the last one of the above described elements, is extremely poisonous, there already exists a technique for making such an oxide harmless to humans with the use of a state-of-the-art equipment that was carefully developed and produced. Actually, there has been a long time since synthetic emerald was introduced as single crystals of an oxide containing beryllium as a main component, and beria single-crystal substrates and beria ceramic have been used in industrial fields.

After the $Al_2O_3$ film 15 is formed, heat treatment is carried out at 1050° C. The heat treatment temperature should be in the range of 950° C. to 1100° C. The $Al_2O_3$ film 14 goes through a phase transition to turn into a transmission alumina structure of the θ-phase, δ-phase, γ-phase, or any other phase of alumina excluding α-phase, so as to be the $Al_2O_3$ film 14a. The $Al_2O_3$ film 15 goes through a phase transition to turn into a transmission alumina structure of the α-phase, so as to be the $Al_2O_3$ film 15a (see FIG. 4). Through the above described heat treatment, a part or all of the $Al_2O_3$ film 14 might be mixed with the SiN film that is the base layer, and a SiAlON layer might be formed. However, such a SiAlON layer is not necessary.

Figure 5A:
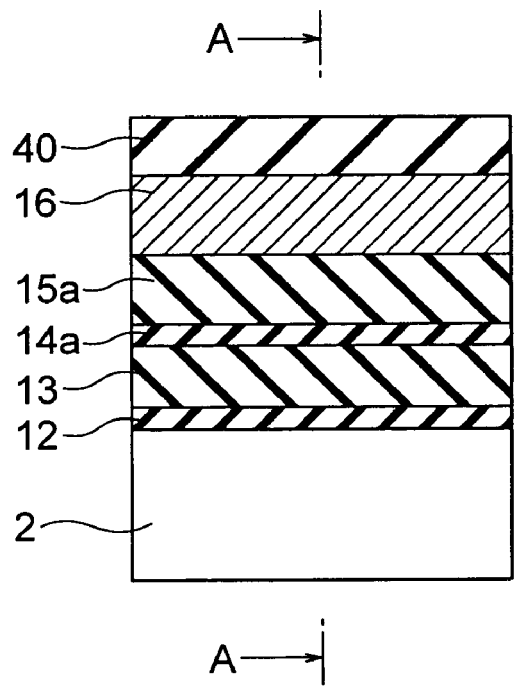
FIGS. 5A through 8B are cross-sectional views illustrating processes for manufacturing the NAND-type MONOS flash memory according to the first embodiment.
Figure 5B:
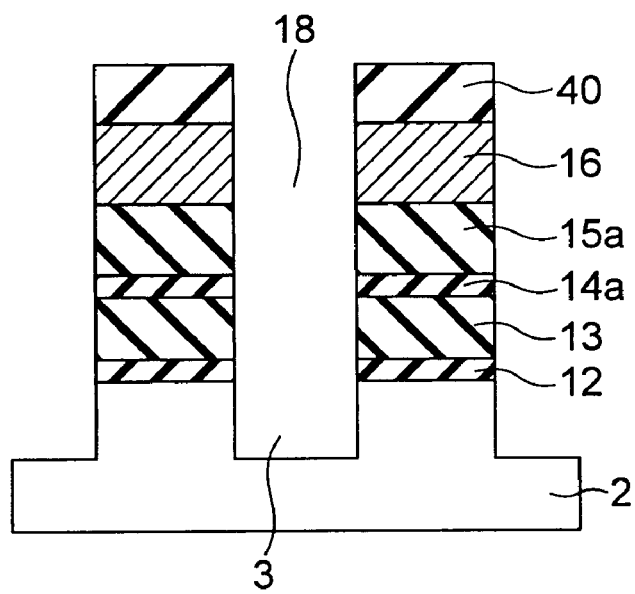

A 100-nm thick phosphorus-doped polycrystalline silicon film is formed as the control gate electrode 16 on the $Al_2O_3$ film 15a, and a mask material 40 that is to be used for forming device isolating regions and is made of $SiO_2$, for example, is formed on the polycrystalline silicon film (see FIGS. 5A and 5B). FIG. 5A is a cross-sectional view of a memory cell, taken along a line extending in the column direction. FIG. 5B is a cross-sectional view of a memory cell, taken along the A-A line of FIG. 5A or a line extending in the row direction. A photoresist is applied onto the mask material 40, and the photoresist is exposed and developed so as to form a resist pattern (not shown). With the resist pattern serving as a mask, patterning is performed on the mask material 40 by RIE (Reactive Ion Etching), so as to transfer the pattern of the resist pattern onto the mask material 40. The resist pattern is then removed. With the mask material 40 serving as a mask, etching is then performed on the polycrystalline silicon film 16, the $Al_2O_3$ film 15a, the $Al_2O_3$ film 14a, the charge storage film 13, and the tunnel insulating film 12 in this order by RIE. In this manner, grooves 18 that isolate each memory cell from the neighboring memory cells in the row direction are formed. Etching is then performed on the silicon substrate 2 by RIE, so as to form 100-nm deep device isolating trenches 3 in the silicon substrate 2 (see FIGS. 5A and 5B).

Figure 6A:
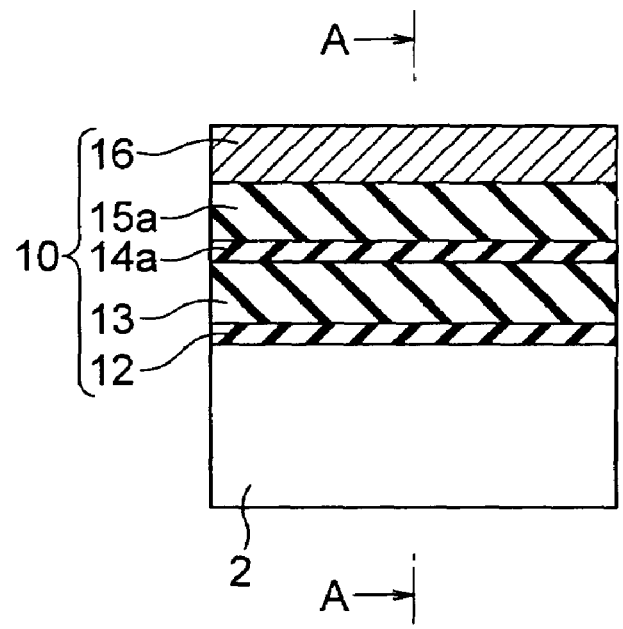
Figure 6B:
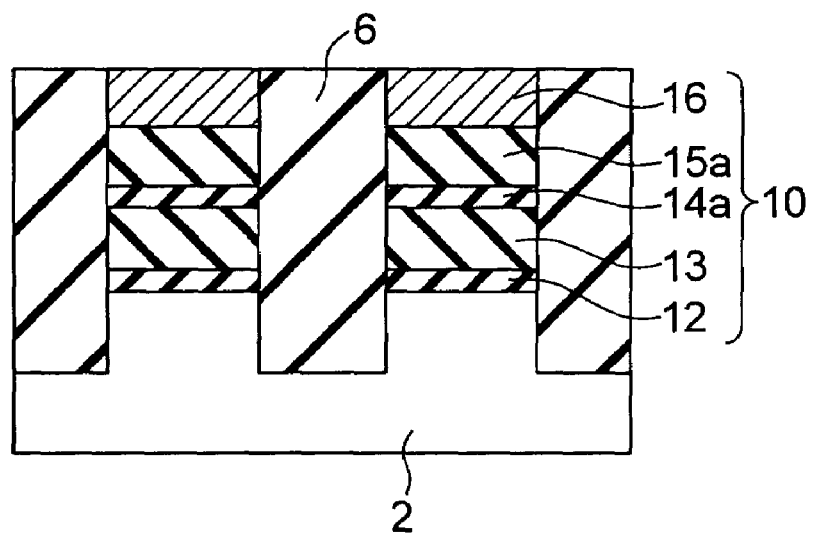

A silicon oxide film (a filling oxide film) 6 to fill each groove 18 and each device isolating trench 3 is formed by CVD. The silicon oxide film 6 is then polished by CMP (Chemical Mechanical Polishing) until the mask material 40 is exposed. In this manner, the surface of the silicon oxide film 6 is flattened. The mask material 40 is then selectively removed. With the use of a diluted hydrofluoric acid solution, etchback is performed on the silicon oxide film 6, so that the height of the silicon oxide film 6 becomes the same as the height of the phosphorus-doped polycrystalline silicon film 16 (see FIGS. 6A and 6B). FIG. 6A is a cross-sectional view of a memory cell, taken along a line extending in the column direction. FIG. 6B is a cross-sectional view of a memory cell, taken along the A-A line of FIG. 6A or a line extending in the row direction.

Figure 7A:
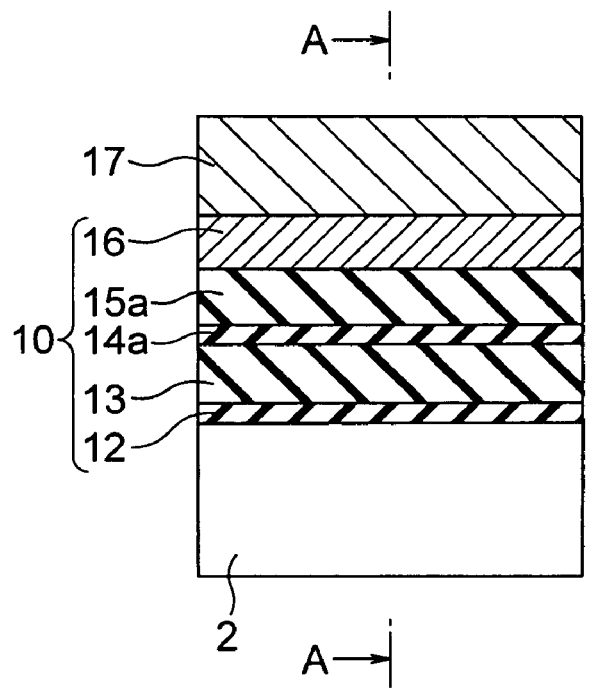
Figure 7B:
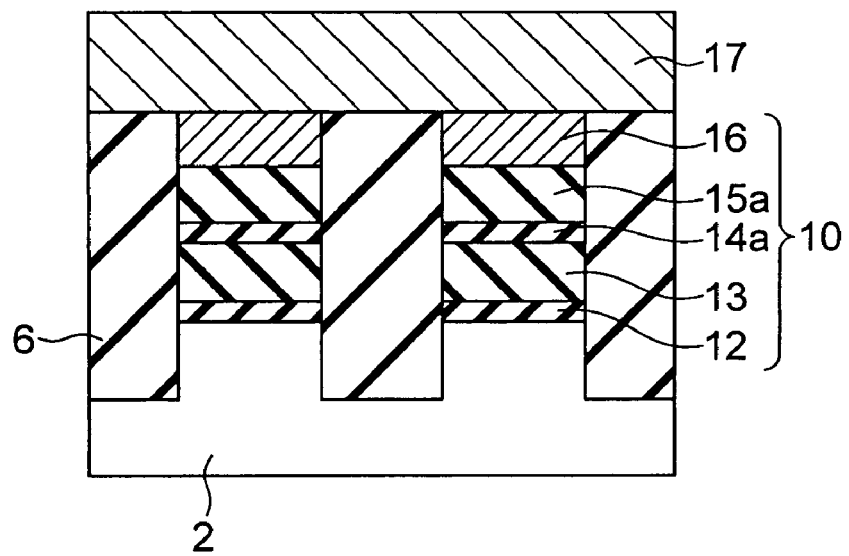

A 100-nm thick conductive film made of tungsten, for example, is formed as the word line 17 on the phosphorus-doped polycrystalline silicon film 16 by CVD (see FIGS. 7A and 7B). FIG. 7A is a cross-sectional view of a memory cell, taken along a line extending in the column direction. FIG. 7B is a cross-sectional view of a memory cell, taken along the A-A line of FIG. 7A or a line extending in the row direction.

Figure 8A:
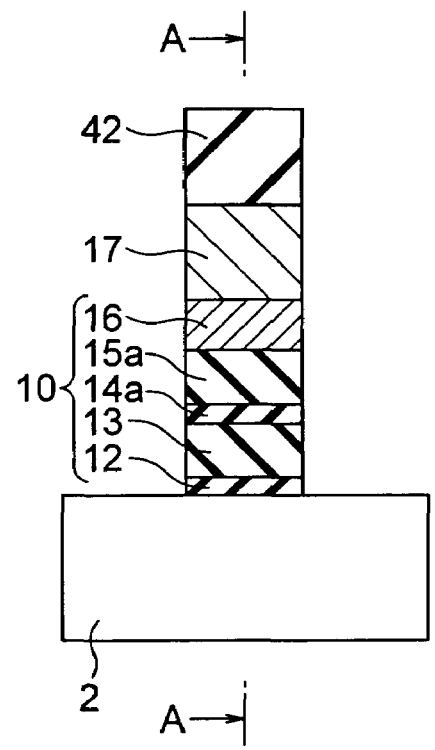
Figure 8B:
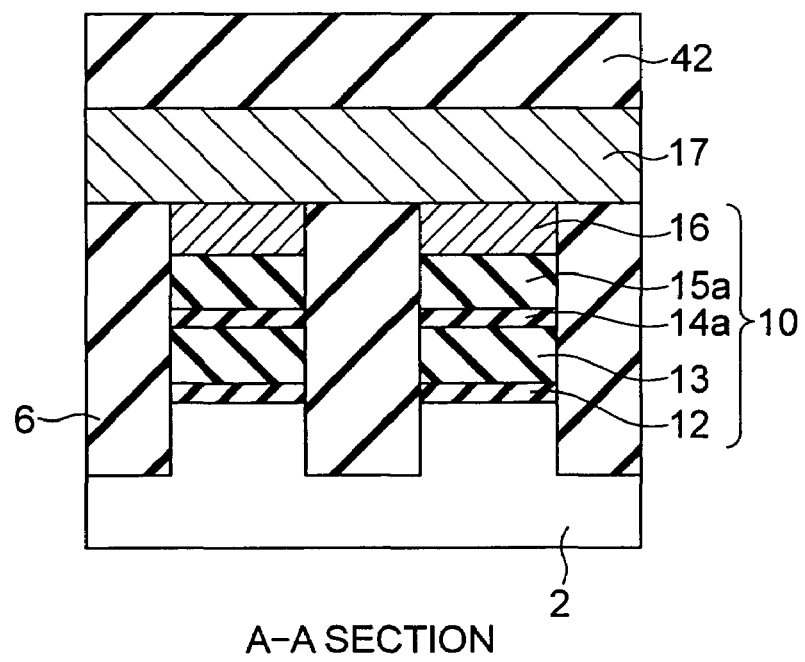

A mask material 42 made of $SiO_2$, for example, is then formed on the conductive film 17 by CVD. After that, a photoresist is formed on the mask material 42, and the photoresist is exposed and developed, so as to form a resist pattern (not shown). With the resist pattern serving as a mask, etching is performed on the mask material 42 by RIE, so as to transfer the pattern of the resist pattern onto the mask material 42. The resist pattern is then removed. With the mask material 42 serving as a mask, etching is performed on the conductive film 17, the polycrystalline silicon film 16, the $Al_2O_3$ film 15a, the $Al_2O_3$ film 14a, the charge storage film 13, and the tunnel insulating film 12 by RIE, so as to form the MONOS gate 10 (see FIGS. 8A and 8B). FIG. 8A is a cross-sectional view of a memory cell, taken along a line extending in the column direction. FIG. 8B is a cross-sectional view of a memory cell, taken along the A-A line of FIG. 8A or a line extending in the row direction. After the mask material 42 is removed, the silicon oxide film 22 is formed at least on the side faces of the MONOS gate 10 by CVD. In this embodiment, the silicon oxide film 22 is also formed on the side faces and the upper face of the conductive film 17 (see FIGS. 1 and 2). After that, the $n^+$-type source/drain diffusion layers 4a and 4b are formed in the surface region of the silicon substrate 2 in a self-aligning fashion through ion implantation, so as to complete each memory cell. The interlayer insulating film 24 to cover each memory cell is then formed by CVD (see FIGS. 1 and 2).

In the above described manner, the fundamental structures of the MONOS flash memory cells of the NAND type to be used in a high-capacity nonvolatile semiconductor memory device are formed.

In a case where the cation element that is added to the $Al_2O_3$ film 14 and has an octacoordinate ion radius of 63 pm or greater is replaced with Al atoms in an $\alpha$-phase alumina or corundum $Al_2O_3$ crystalline structure during the manufacturing of the nonvolatile semiconductor device of this embodiment, the cation element is too large to form an $\alpha$-phase crystalline structure. As a result, the $\alpha$-phase alumina crystalline structure becomes unstable in terms of thermodynamics. On the other hand, in a case where the cation element having an ion radius of 63 pm or greater is replaced with Al atoms in a transition alumina structure of the $\theta$-phase, $\alpha$-phase, or $\gamma$-phase, the Al atomic site in the transition alumina structure of the $\theta$-phase, $\delta$-phase, or $\gamma$-phase has a large enough size to stabilize the transition alumina structure of the $\theta$-phase, $\delta$-phase, or $\gamma$-phase in terms of thermodynamics. In other words, through heat treatment at a sufficiently high temperature, such a structure having impurity ions added thereto can go through a phase transition to turn into a transition alumina structure of the $\theta$-phase, $\delta$-phase, or $\gamma$-phase that is a stable phase in terms of thermodynamics. Likewise, if the anion ion radius becomes 132 pm or greater, the minute and dense corundum crystals become unstable, and a transition alumina structure of the $\theta$-phase, $\alpha$-phase, or $\gamma$-phase that is relatively sparse becomes more stable. Because any other transition alumina phase has larger Al atomic site than $\alpha$-phase, they are considered to be more stable than $\alpha$-phase.

A transition alumina structure of the $\theta$-phase, $\delta$-phase, or $\gamma$-phase is generally a structure that has a large surface or a large interface, and is known to have catalytic influence, high chemical reactivity, and many electric defects. Therefore, the $Al_2O_3$ film 14a serving as transition alumina immediately above the SiN film as the charge storage film 13 is provided so as to increase the charge trapping efficiency. Having high chemical reactivity, the transition alumina might be mixed with the SiN film that is the charge storage film 13 through heat treatment, and might turn into a SiAlON film. As described above, the addition of Si or N stabilizes the transition alumina, and SiAlON, which is obtained from those elements, is expected to have a large number of electric defects and increase the charge trapping efficiency.

The $Al_2O_3$ film 14a having the high charge trapping efficiency should be located in a region of the charge storage film 13 further away from the tunnel insulating film 12, rather than in a region of the charge storage film 13 closer to the tunnel insulating film 12 (see FIG. 1). With the gate structure of this embodiment, a transition alumina layer or a SiAlON layer that efficiently traps charges is generated in a preferred position. Meanwhile, the $Al_2O_3$ film 15a is an insulating film for inducing a high electric field that enables charges tunneling through the tunnel insulating film 12 to enter the charge trapping film, and is required to have a small number of electric defects and low leakage current. An insulating film that exhibits the required characteristics is an $\alpha$-phase $Al_2O_3$ film. It is known that an $Al_2O_3$ film not having an element added thereto turns into the $\alpha$-phase in a phase transition at a heat treatment temperature of approximately 1050° C. Accordingly, the $Al_2O_3$ film 15a fulfills the above objectives. In a case where an element having an octacoordinate ion radius that is smaller than 63 pm but greater than 53 pm is added to the $Al_2O_3$ film 14a, the element enters a large cation site of the transition alumina, and causes lattice relaxation in the vicinities of the added atoms. As a result, an increase in the energy of the surrounding crystalline lattice leads to an increase in the entire crystalline lattice energy. In a case where atoms having an appropriate ion radius enters the cation site of the $\alpha$-phase $Al_2O_3$ film 15a, a large decrease in the energy is caused by the lattice relaxation in the vicinities of the added atoms. As a result, the crystalline lattice energy becomes equal to or smaller than that of an $Al_2O_3$ film not having an element added thereto, which is preferable.

This embodiment is characterized in that, through one-time heat treatment, a transition alumina layer is formed in a region that should preferably have high charge efficiency, and an $\alpha$-phase alumina layer is formed in a region that should preferably have low charge efficiency in the stack structure of the $Al_2O_3$ film 14 and the $Al_2O_3$ film 15. Since the transition alumina layer and the $\alpha$-phase alumina layer have a stoichiometric composition or an oxygen-deficient composition, this embodiment can prevent the generation of excess oxygen. Here, a stoichiometric composition has a chemical state in which the total sum of the products of the coefficients of each element forming a composition formula and the atomic valence (an integer) of each element is zero. To obtain the above total sum, each atom to be a cation should have a positive integer, and each atom to be an anion should have a negative integer. Although this is well known to those skilled in the art and there is no need to explain Pauling's second rule, the above facts should be noted nonetheless.

As described above, in accordance with this embodiment, the crystalline structure of an $Al_2O_3$ is optimized, and the lower layer portion of the $Al_2O_3$ film has a transition alumina crystalline structure that is suitable for efficiently trapping charges. The other portion than the lower layer portion of the $Al_2O_3$ film has an $\alpha$-phase alumina crystalline structure with few electric defects. In this manner, a nonvolatile semiconductor memory device having MONOS memory cells having the highest possible charge trapping efficiency can be achieved.

JP-A 2006-203200 (KOKAI) discloses that $((Hf, Zr, Y \text{ or } Ln)O_2)_x(Al_2O_3)_{1-x}$ $(0.03 \leq x \leq 0.26)$ is used as a tunnel oxide layer or a blocking layer. Here, Ln is La, Ce, Pr, Nd, Pm, Sm, Eu, Gd, Tb, Dy, Ho, Er, Tm, Yb, or Lu. However, it is known that Y and most Ln are in a trivalent atomic state. Particularly, in a case where (Y or Ln) is used in the composition disclosed in JP-A 2006-203200 (KOKAI), it is considered that excess oxygen as in $((Y \text{ or } Ln)O_{1.5})_x(Al_2O_3)_{1-x}(O)_{0.5x}$ cannot be avoided.

Unlike the films containing alumina in this embodiment, the film containing alumina disclosed in JP-A 2006-203200 (KOKAI) generates excess oxygen. A method for forming a film containing such a large amount of excess oxygen is not generally known, and JP-A 2006-203200 (KOKAI) does not teach a method that can be utilized in practice. Even if such a film is formed by an extremely sophisticated technique, diffusion into the charge storage film and the control gate electrode film in the surrounding area is caused due to the heat treatment or the like carried out in later procedures. As a result, degradation of the write characteristics and erase characteristics are predicted due to a decrease in charge trapping efficiency and the degradation of the interface with the control gate electrode film. As will be described later, the existence of excess oxygen can be easily detected by checking the peak profile of O1s by XPS (X-ray photoemission spectroscopy), as long as the composition amount is close to the composition amount of the film disclosed in JP-A 2006-203220 (KOKAI). If X-rays of a synchrotron radiation source are used, even a very small amount can be detected. Being a radioactive element, Pm, which is one of Ln disclosed in JP-A 2006-203220 (KOKAI), might cause a bit error or the like, and is not suitable for an electron circuit. It is also known that Pr and Tb, which are Ln disclosed in JP-A 2006-203200 (KOKAI), are not in a perfect trivalent state but in a mixed state or an intermediate state of a trivalent state and a tetravalent state, such as $Pr_6O_{11}$ (a long-period structure formed with a $Pr_2O_3$ unit and a $4PrO_2$ unit) or $Tb_4O_7$ (a long-period structure formed with a $Tb_2O_3$ unit and a $2TbO_2$ unit). Accordingly, a large amount of excess oxygen exists in $(PrO_{1.833})_x (Al_2O_3)_{1-x}(O)_{0.166x}$ or $(TbO_{1.75})_x(Al_2O_3)_{1-x}(O)_{0.25x}$, and the above described problems with Y and other Ln are also caused. Meanwhile, Ce, which is also one of Ln disclosed in JP-A 2006-203200 (KOKAI), is relatively stable in a tetravalent state. However, oxygen is easily detached through heat treatment at 727° C. or higher as in a LSI, and is reduced to $Ce_2O_3$ (see Wende Xiao, Qinlin Guo, and E. G. Wang, "Transformation of $CeO_2(111)$ to $Ce_2O_3$ (0001) films", Chemical Physics Letters 368, 527-531 (2003), for example). Therefore, as with Ln, there are problems caused by the generation of oxygen from a $(CeO_2)_x (Al_2O_3)_{1-x}$ ($0.03 \leq x \leq 0.26$) film.

In this embodiment, on the other hand, the transition alumina and α-phase alumina each have a stoichiometric composition or an oxygen-deficient composition. Accordingly, the generation of excess oxygen can be prevented, and oxygen diffusion into the charge storage film and the control gate electrode film due to the heat treatment carried out in the later steps can be avoided. Thus, a decrease in charge trapping efficiency and degradation of the interface with the control gate electrode film can be prevented. As a result, degradation of the write characteristics and erase characteristics can be prevented.

To determine whether a thin film formed with an oxide has a stoichiometric composition or an oxygen-deficient composition, the photoemission energy can be checked by XPS (X-ray photoelectron spectroscopy). In a case of a metal oxide having a sufficient amount of oxygen and a stoichiometric composition, only the peaks in such energy positions derived from the metal-oxygen bonds are observed as a result of a check made on the spectrum of the photoemission energy from the metal atoms. In a case of a metal oxide in an oxygen-deficient state in which a sufficient amount of oxygen does not exist, on the other hand, metal-metal bonds are naturally formed, as the amount of oxygen is not large enough to occupy the metal bonding hands. There is a peak energy difference between the photoelectron peak of such metal-metal bonds and the photoelectron peak of metal-oxygen bonds, due to the difference in electronegativity between metal and oxygen. Accordingly, peak separation is normally easy.

Meanwhile, an oxygen excess state can be detected from a significant difference in the energy position of the peak of the photoelectrons from oxygen atoms, and a difference between oxygen-metal bonds and oxygen-oxygen bonds. Even if there is detached oxygen in $LaO_2$ or the like in an oxygen excess state (though such a case is very difficult to imagine), it is possible to predict the photoelectron peak energy from the La metal in theory, and accordingly, the oxygen excess state can be readily detected. The oxygen amount in such cases is estimated by an already established technique. By such a technique, X-rays from a radiation source are collimated by a collimator having a hole of several nanometers in size even in a very small region of several nanometers in area size, and searching the region irradiated with X-rays with the use of a microscope. The accuracy in the estimation of the amount of oxygen deficiency is generally 1 atomic % or higher. Accordingly, the difference between $La_2O_3$ and $LaO_2$, for example, can be certainly detected.

As described above, the film disclosed in JP-A 2006-203200 (KOKAI) and the film in accordance with this embodiment differ from each other in structure and effects.

As in this embodiment, a film containing transition alumina and α-phase alumina having a stoichiometric composition or an oxygen-deficient composition is used for the gate structure, so as to increase the charge trapping efficiency to the highest possible value. This is a fact discovered by the inventors of the present invention.

In this embodiment, the transition alumina and the α-phase alumina are stoichiometric compositions or oxygen-deficient compositions. An example case of a nonstoichiometric composition or an oxygen-deficient composition is now described. It is known that the transition metal elements among the first impurity elements that can be added to the alumina, more particularly, the elements of Group 4, Group 5, Group 6, Group 7, Group 8, Group 9, and Group 10 of the periodic table are stable in two or more valence state. Especially, Ti, Hf, Zr, Ta, Nb, V, W, Mo, Os, Ir, Pt, Ru, Rh, or Pd, which is added as trivalent Ti, might turn into tetravalent Ti through heat treatment.

However, such a change into a different state causes an oxygen-deficient state in the alumina, but does not cause the oxygen excess state disclosed in JP-A 2006-203200 (KOKAI). Therefore, there is no adverse influence of oxygen access. Meanwhile, the oxygen-deficient alumina forms a trap site that is deep in terms of energy, and turns into a very preferred charge storage layer. Such a preferred effect can be achieved with trivalent or tetravalent Hf, trivalent or tetravalent Zr, trivalent or pentavalent Ta, trivalent or pentavalent Nb, trivalent or pentavalent V, trivalent, tetravalent, or hexavalent W, trivalent, tetravalent, or hexavalent Mo, any of trivalent through octavalent Os, any of trivalent through octavalent Ir, any of trivalent through octavalent Pt, any of trivalent through octavalent Ru, any of trivalent through octavalent Rh, or any of trivalent through octavalent Pd. It should be understood that, even if those transition metal elements do not cause an oxygen-deficient state in the alumina base material, the change in the alumina crystalline structure causes the preferred effect of increasing the charge trapping efficiency.

As for In, Pb, Sn, Si, Ba, Sr, Ca, Bi, Sb, and As, which are the representative elements among the other first impurity elements, and Zn and Cd, which are transition elements close to the representative elements, In, Pb, Sn, Si, Bi, Sb, and As may be added as a trivalent element, and can be expected to have the same effects as those of the above described transition metal elements that have a higher valence than trivalence as a result of heat treatment and causes an oxygen-deficient state in the alumina as the base material. Even if an oxygen-deficient state is not caused, a change in the crystalline structure leads to a preferred effect, as described above. It is preferable that Ba, Sr, Ca, Zn, and Cd are added as bivalent elements from the start. As is apparent from the fact that the addition of Ba, Sr, Ca, Zn, and Cd is carried out in an ultimate form of a spinel structure or a γ-phase alumina structure even in a natural state, neither an oxygen excess state nor an oxygen-deficient state affects the phase transition energy and causes any problem, even if a transition alumina structure is easily formed or the valence changes from bivalence.

In the cases of N, Te, Se, and S, which are the anions among the other elements to be added, the transition alumina structure is normally stabilized by replacing the anion site. However, those anions have more than one kind of valence, and do not have the electronegativity as high as that of oxygen. Therefore, those anions serve as cations in some cases. More specifically, N is in a state ranging from a negative trivalent state (anion) to a pentavalent state (cation). Te, Se, and S are in a state ranging from a negative bivalent state (anion) to hexavalent state (cation).

Among the first impurity elements, Pr, La, Ce, Nd, Sm, Eu, Gd, Tb, Dy, Ho, Er, Tm, Yb, Lu, Y, and Sc need to be added as trivalent elements, so as not to cause an oxygen excess state in the alumina base material.

The second impurity elements to be added to the alumina, which are Ga, Co, Ni, Fe, Cr, and Mn, are preferably added as trivalent elements. However, Ni may be added in some other state such as a bivalent state. In general, Ga cannot be in any other state than a trivalent state. On the other hand, Co may be in a state ranging from a zerovalent state to an octavalent state, Ni in a state ranging from a bivalent state to an octavalent state, Fe in a state ranging from a bivalent state to an octavalent state, Cr in a state ranging from a bivalent state to a hexavalent state, and Mn in a state ranging from a bivalent state to a septavalent state. Any of the second impurity elements in such states forms a deep trap site in the α-phase alumina base, and reduces the leakage current by trapping the leakage current. Those second impurity elements in the above states are especially effective in improving the retention properties. Those second impurity elements may exist as trivalent elements, and only stabilize the α-phase alumina structure, which is also preferable.

(Modification)

Next, a modification of the first embodiment is described. In the first embodiment, an element is selected to obtain alumina of the α-phase or a corundum structure, and Ga is taken as an example of the optimum element. If a deep trap site is formed in the α-phase alumina, the leakage current is reduced, being trapped in the deep trap site. Accordingly, improvement in the flash memory characteristics is expected. Examples of such elements that are suitable for forming a deep trap site and can form an α-phase alumina structure include Fe, Co, Ni, and Be, which can be in a stable bivalent state. Particularly, bivalent Be is very stable and is desirable in view of this aspect. However, careful measures against the extremely poisonous properties need to be taken, resulting in high industrial costs. With this fact being taken into consideration, bivalent Co is the most stable among the other elements, and is considered to be preferable.

In this modification, any of Fe, Co, Ni, and Be is used, instead of Ga, so as to form a corundum structure of alumina. With any of those elements, a deep trap site can be formed in the α-phase alumina, and the flash memory characteristics can be improved.

Second Embodiment

Next, a nonvolatile semiconductor memory device in accordance with a second embodiment of the present invention is described.

A method for manufacturing the nonvolatile semiconductor memory device in accordance with this embodiment differs from the manufacturing method in accordance with the first embodiment. In the first embodiment, the two alumina films of the $Al_2O_3$ film 14 and the $Al_2O_3$ film 15 are stacked. In this embodiment, on the other hand, a single-layer $Al_2O_3$ film 34 is formed on the charge storage film 13, and impurity ions are implanted into the $Al_2O_3$ film 34. This $Al_2O_3$ film 34 has an impurity concentration distribution in the film thickness direction (see FIGS. 9(a) and 9(b)).

By the method for manufacturing a nonvolatile semiconductor memory device in accordance with this embodiment, a tunnel insulating film 12 and a charge storage film 13 are formed on the semiconductor substrate 2, as in the nonvolatile semiconductor memory device manufactured in accordance with the first embodiment. A 12-nm $Al_2O_3$ film 34 having no impurity ions added thereto is then formed. After the formation of the $Al_2O_3$ film 34 having no impurity ions added thereto, Nd ions are added as the first impurity element to the vicinity of the lower face of the $Al_2O_3$ film 34 (or to the vicinity of the interface between the $Al_2O_3$ film 34 and the charge storage film 13) through ion implantation. Fe is added as the second impurity element to the other regions of the $Al_2O_3$ film 34 than the lower interface. The ion implantation may be performed after a control gate electrode film is formed on the $Al_2O_3$ film 34, or may be performed after a dummy film is formed on the $Al_2O_3$ film 34. By utilizing such a manufacturing method, a distribution of the impurity concentration is caused in the $Al_2O_3$ film 34 in the film thickness direction.

Instead of Nd, it is possible to use one or more of the following elements: Pr, La, Ce, Sm, Eu, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu. Instead of Fe, it is possible to use one or more of the following elements: Ga, Co, Ni, Cr, and Mn.

Figure 9:
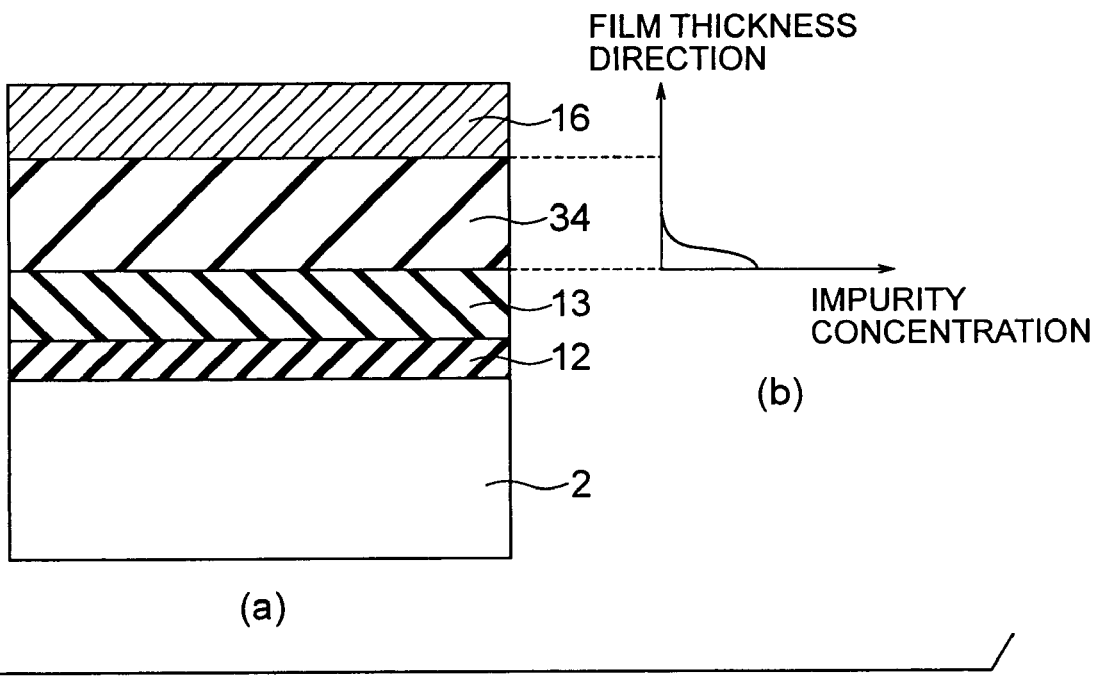
FIGS. 9(a) and 9(b) illustrate a NAND-type MONOS flash memory according to a second embodiment.

Particularly, when Nd ions are implanted into the lower interface of the $Al_2O_3$ film 34, it is the most preferable that ion implantation is performed so as to form the concentration peak of Nd in the lower interface portion in the $Al_2O_3$ film 34 as shown in FIG. 9(b). If such preferred impurity implantation is performed, impurity ions are also injected into the charge storage film 13 below the $Al_2O_3$ film 34. As a result, the existence of the impurity ions in the charge storage film 13 conveniently increases the charge trapping efficiency of the charge storage film 13. When one or more elements among Pr, La, Ce, Sm, Eu, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu, it is preferable that impurity implantation is performed so as to form a distribution in the film thickness direction as in the case of Nd.

Figure 10:
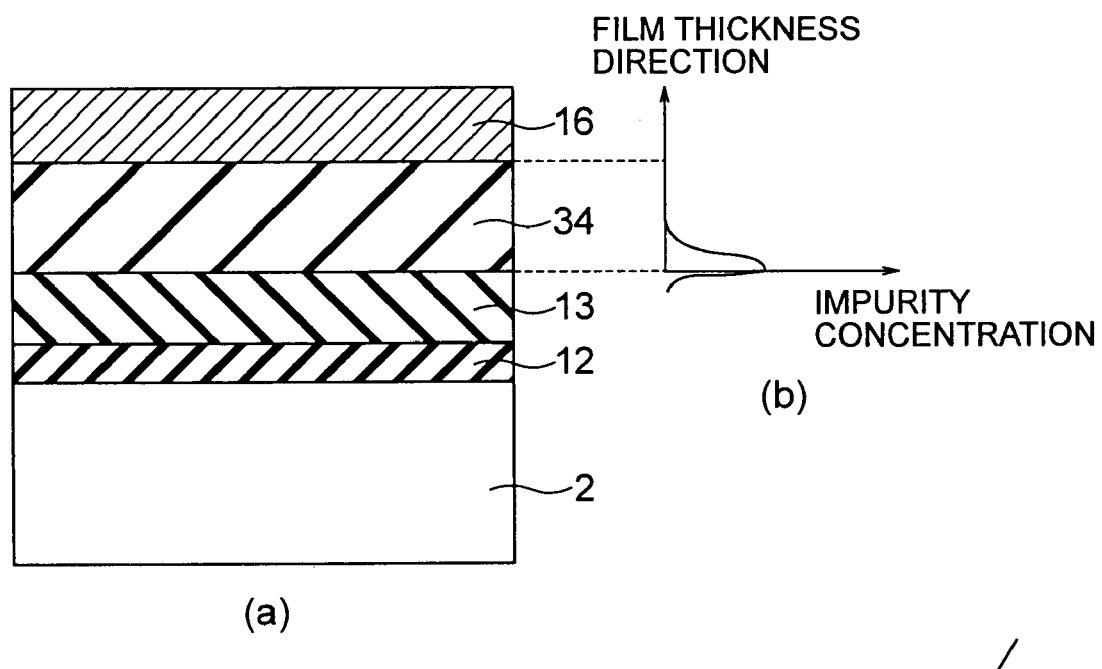
FIGS. 10(a) and 10(b) illustrate a NAND-type MONOS flash memory according to a first modification of the second embodiment.
Figure 11:
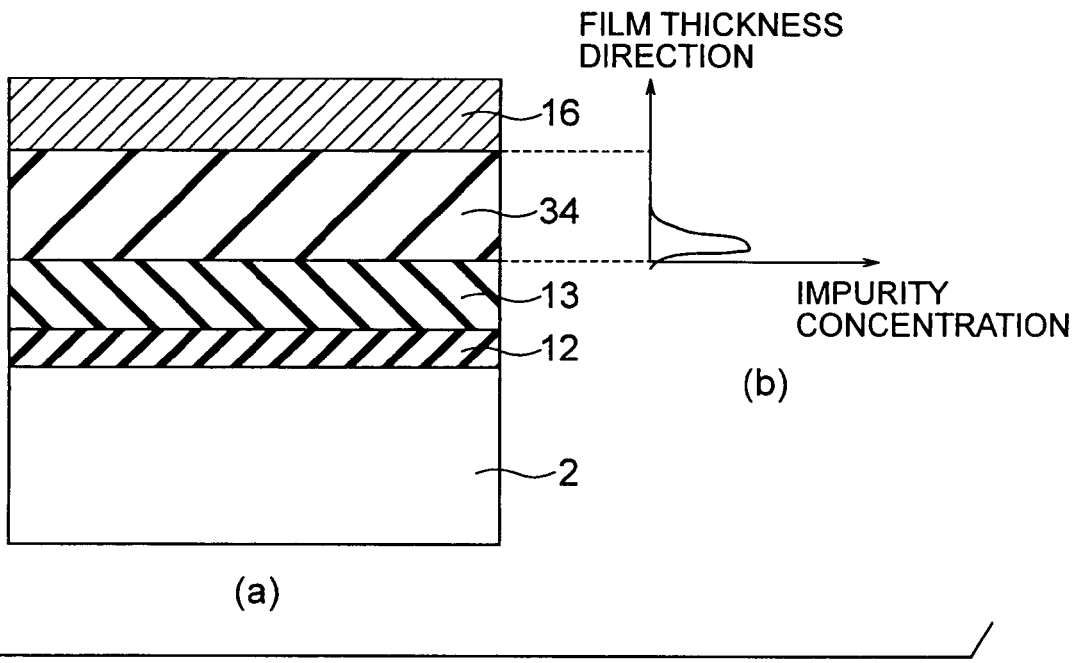
FIGS. 11(a) and 11(b) illustrate a NAND-type MONOS flash memory according to a second modification of the second embodiment.
Figure 12:
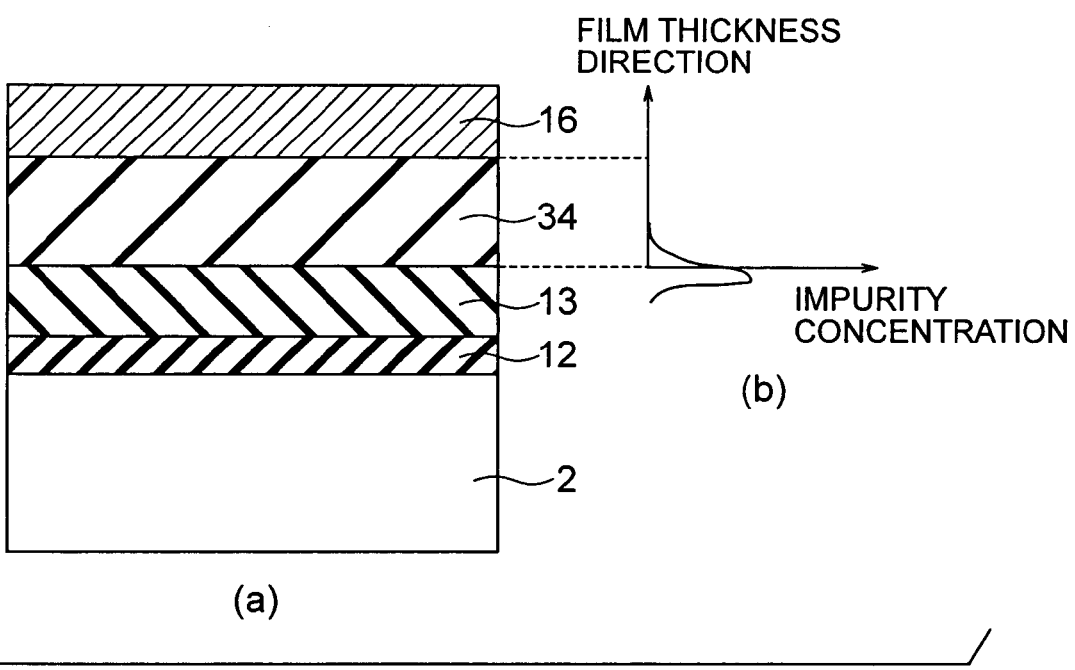
FIGS. 12(a) and 12(b) illustrate a NAND-type MONOS flash memory according to a third modification of the second embodiment.
Figure 13:
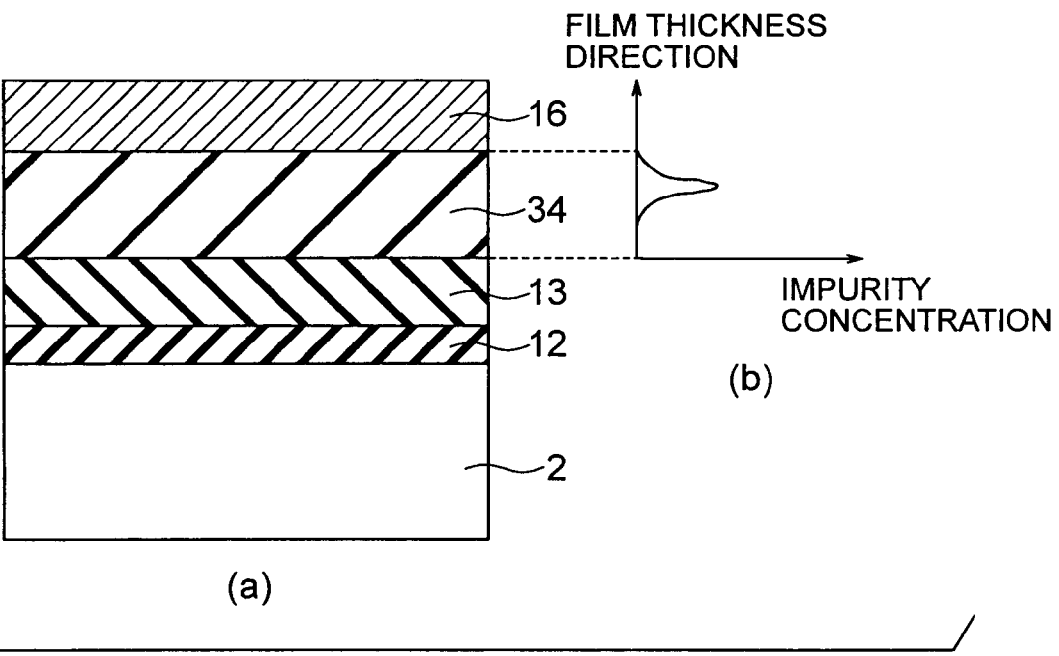
FIGS. 13(a) and 13(b) illustrate a NAND-type MONOS flash memory according to a fourth modification of the second embodiment.

After impurity implantation is performed, the profiles shown in FIGS. 10(a) and 10(b) or the profiles shown in FIGS. 11(a), 11(b), 12(a), and 12(b) might be formed in reality. In those profiles, the impurity seeps into the charge storage film 13. As long as the charge storage film 13 is made of SiN, which is a common material, the trapping efficiency at the time of charge writing is not decreased, and impurity levels to degrade the erase characteristics at the time of charge erasing are not generated, even if the impurity ions seep into the charge storage film 13. Therefore, adverse influence should not be caused. Also, if the charge storage film 13 is made of an oxynitride of Hf, Zr, Sc, Y, Ln (La, Ce, Pr, Nd, Sm, Eu, Gd, Tb, Dy, Ho, Er, Tm, Yt, or Lu), Ta, Nb, W, or Mo, adverse influence should not be caused. For example, in a case where the charge storage film 13 below the $Al_2O_3$ film 34 contains crystalline particles, the impurity ions might be diffused into the tunnel insulating film 12 due to the heat treatment to be carried out in the later processes. In such an example, the profile having an impurity peak in the charge storage film 13 as shown in FIGS. 12(a) and 12(b), and the profile having a large portion of the impurity seeping into the charge storage film 13 as shown in FIGS. 10(a) and 10(b) are not suitable. Rather, the profile shown in FIGS. 11(a) and 11(b) is preferred, having the impurity concentration reduced at a point very close to the interface with the charge storage film 13. If the impurity diffusion into the charge storage film 13 is not so conspicuous, the example case shown in FIGS. 12(a) and 12(b) is not conceivable, but the cases shown in FIGS. 9(a) and 9(b), FIGS. 10(a) and 10(b), and FIGS. 11(a) and 11(b) are conceivable.

Figure 14:
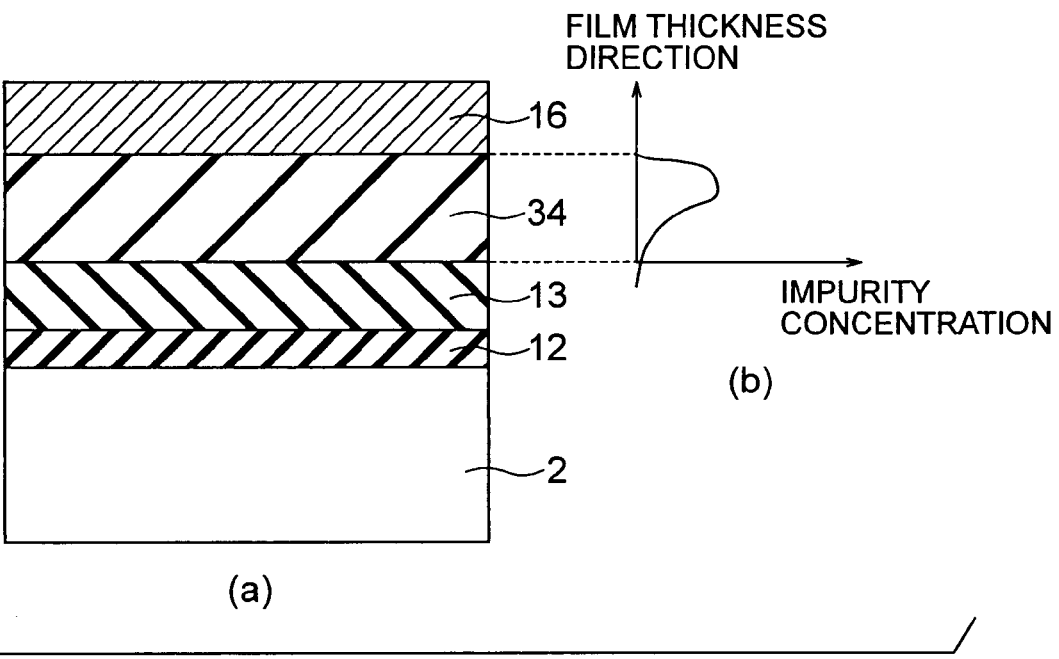
FIGS. 14(a) and 14(b) illustrate a NAND-type MONOS flash memory according to a fifth modification of the second embodiment.
Figure 15:
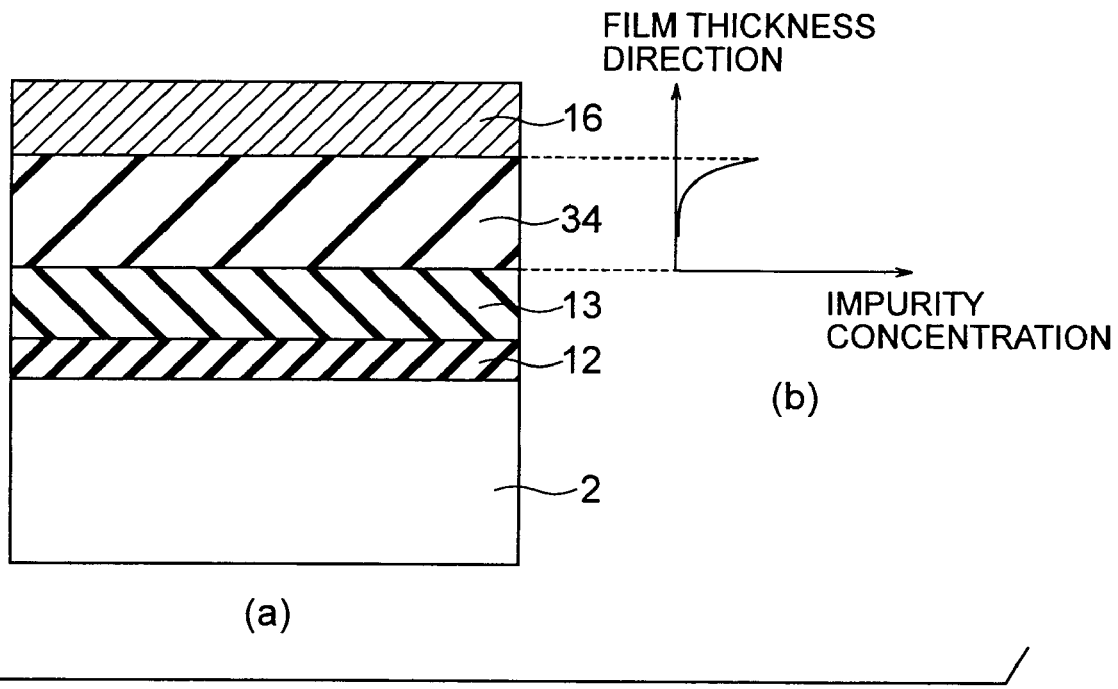
FIGS. 15(a) and 15(b) illustrate a NAND-type MONOS flash memory according to a sixth modification of the second embodiment.
Figure 16:
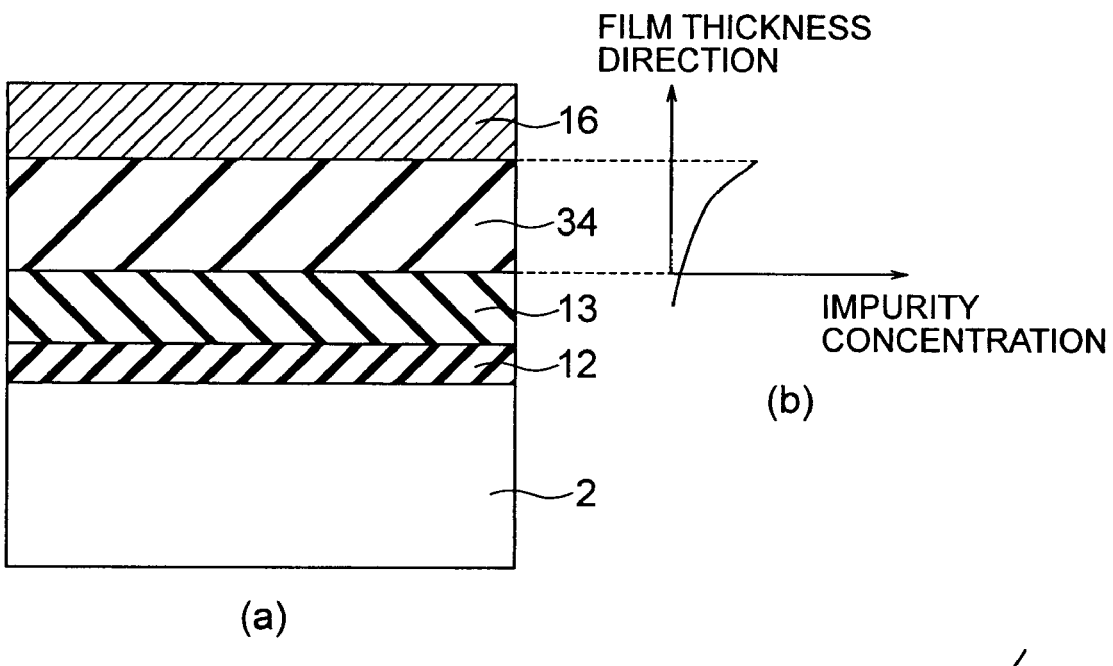
FIGS. 16(a) and 16(b) illustrate a NAND-type MONOS flash memory according to a seventh modification of the second embodiment.
Figure 17:
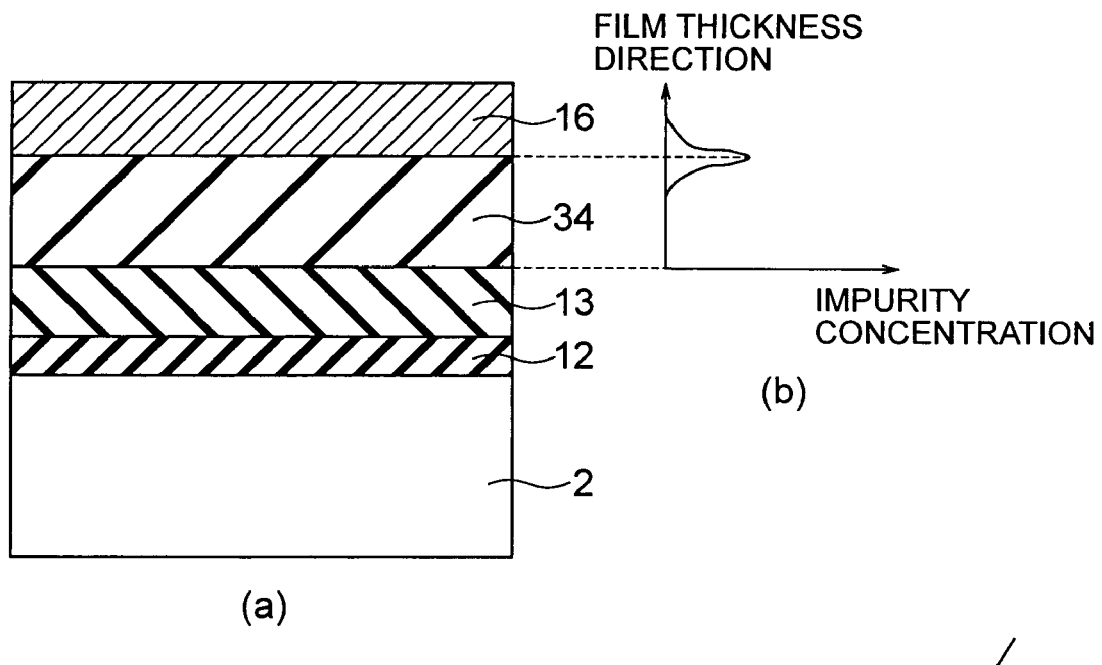
FIGS. 17(a) and 17(b) illustrate a NAND-type MONOS flash memory according to a eighth modification of the second embodiment.

In a case Fe is added to the portions other than the lower interface of the $Al_2O_3$ film 34, impurity implantation may be performed so that an impurity concentration peak appears in the $Al_2O_3$ film 34 as shown in FIGS. 14(a) and 14(b), or impurity implantation may be performed so that an impurity concentration peak appears at the upper interface portion of the $Al_2O_3$ film 34 as shown in FIGS. 15(a) and 15(b) or FIGS. 16(a) and 16(b). Also, the skirt of the impurity concentration peak may extend to the lower interface portion of the $Al_2O_3$ film 34, as shown in FIGS. 14(a) and 14(b) or FIGS. 16(a) and 16(b).

Figure 18:
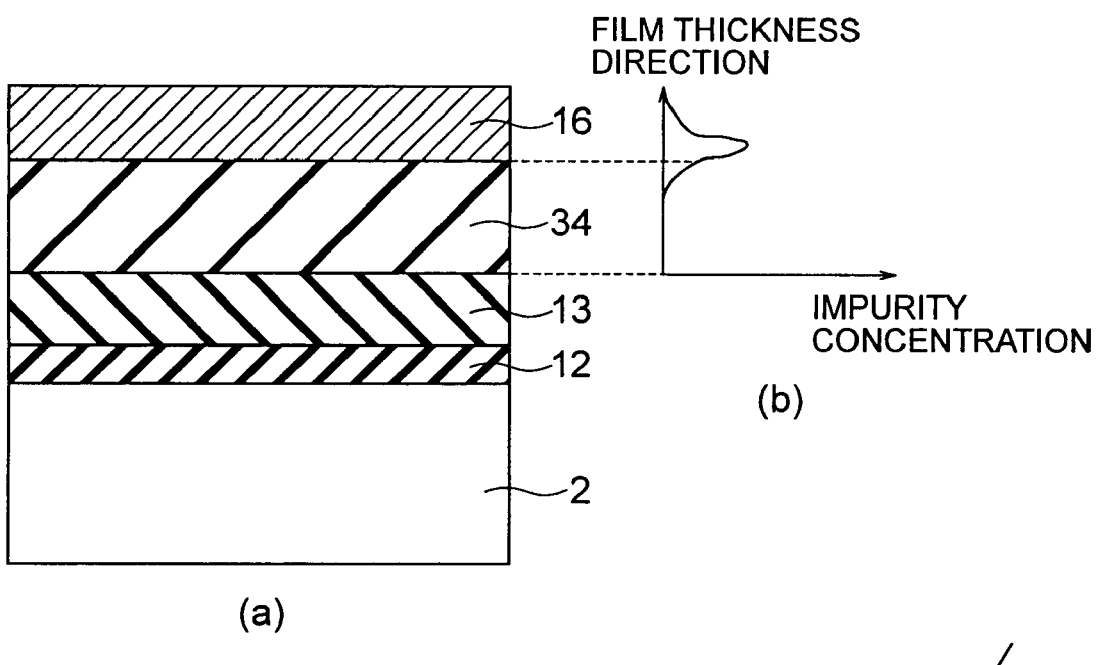
FIGS. 18(a) and 18(b) illustrate a NAND-type MONOS flash memory according to a ninth modification of the second embodiment.
Figure 19:
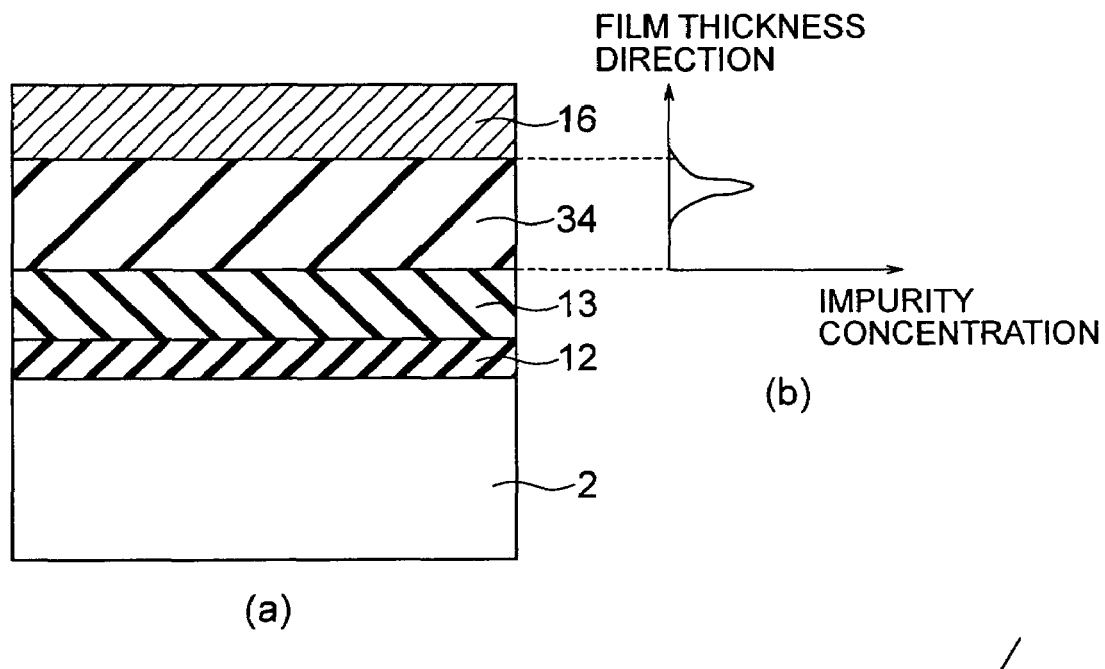
FIGS. 19(a) and 19(b) illustrate a NAND-type MONOS flash memory according to a tenth modification of the second embodiment.
Figure 20:
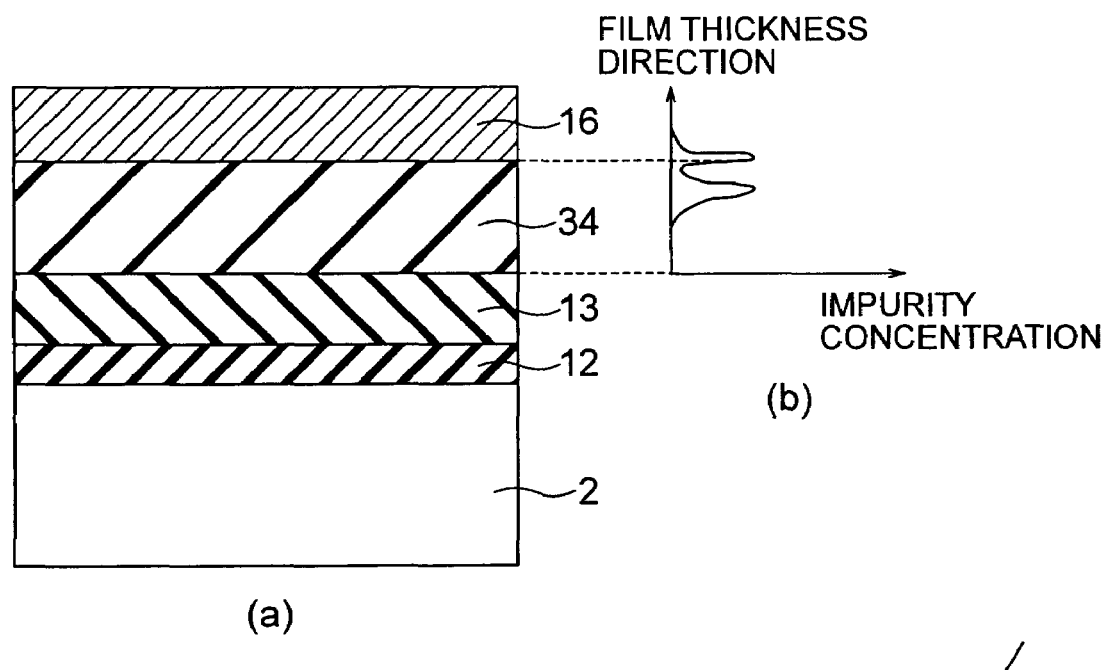
FIGS. 20(a) and 20(b) illustrate a NAND-type MONOS flash memory according to a eleventh modification of the second embodiment.

In a case where impurity implantation is performed so that an impurity concentration peak appears at the upper interface portion of the $Al_2O_3$ film 34 as shown in FIGS. 15(a) and 15(b) or FIGS. 16(a) and 16(b), the work function of the control gate electrode 16 having impurity ions added thereto can be modulated as well. Where the work function of the control gate electrode 16 is modulated as well, it is preferable that ion implantation is performed after the formation of the control gate electrode 16. By utilizing this manufacturing method, a structure having the impurity ions seeping into the control gate electrode 16 is obtained, as shown as an ultimate impurity profile achieved through the later processes in FIGS. 17(a) and 17(b), FIGS. 18(a) and 18(b), FIGS. 19(a) and 19(b), or FIGS. 20(a) and 20(b). Particularly, as shown in FIGS. 18(a) and 18(b), it is preferable that the impurity concentration in the control gate electrode 16 is higher than the impurity concentration in the $Al_2O_3$ film 34. Alternatively, as shown in FIGS. 20(a) and 20(b), it is more preferable that a profile having impurity ions deflected from the interface between the control gate electrode 16 and the $Al_2O_3$ film 34 is formed, instead of a continuous profile.

After the ion implantation, heat treatment is carried out at 1100° C., for example, so that the lower layer of the $Al_2O_3$ film 34 goes through a phase transition to a transition alumina layer, and the upper layer goes through a phase transition to an α-phase alumina layer. As a result, the same two-layer alumina structure as that of the first embodiment is obtained. Thereafter, the same manufacturing procedures as those of the first embodiment are carried out, to complete a MONOS flash memory of the NAND type. The heat treatment at 1100° C. may not be performed immediately after the ion implantation, but may be performed at a step later than the ion implantation step.

In this embodiment, it is possible to eliminate the problem of the technical difficulty in forming an $Al_2O_3$ film having impurity ions added thereto by a film forming method such as CVD.

Since this embodiment has the same structure as that of the first embodiment, a nonvolatile semiconductor memory device having MONOS memory cells having the highest possible charge trapping efficiency can be obtained.

Third Embodiment

Figure 21:
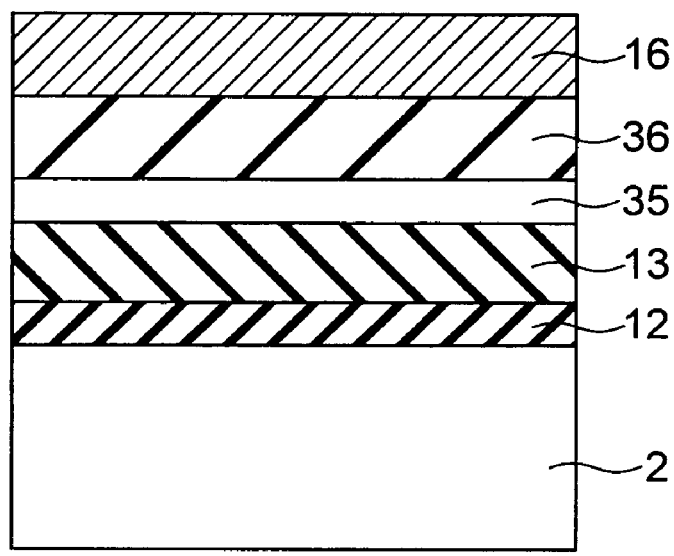
FIG. 21 illustrates a cross-sectional view of a NAND-type MONOS flash memory according to a third embodiment.

Next, a nonvolatile semiconductor memory device in accordance with a third embodiment of the present invention is described. As in the first embodiment, a tunnel insulating film 12 and a charge storage film 13 are also formed on a silicon substrate 2 in this embodiment. After that, a $Cr_2O_3$ film 35 of 0.5 nm in film thickness is formed. Here, the film formation may be carried out by CVD or PVD. An $Al_2O_3$ film 36 of 8 nm in film thickness is then formed on the $Cr_2O_3$ film 35 at 230° C. or higher (see FIG. 21). By this film forming method, the $Cr_2O_3$ film 35 serves as a template, and the α-phase alumina can be formed at a low temperature, which is very advantageous. Other examples of materials that can be suitably used as the temperature include $Ti_2O_3$ film, $Fe_2O_3$ film, $Ga_2O_3$ film, $CO_2O_3$ film, $Ni_2O_3$ film, and $Mn_2O_3$ film. After that, the same procedures as those of the first embodiment are carried out to form a MONOS flash memory of the NAND type.

In this embodiment, through the heat treatment to be carried out in the later procedures for manufacturing the flash memory, the $Cr_2O_3$ film 35 may be partially or totally absorbed into the $Al_2O_3$ film 36 located on the $Cr_2O_3$ film 35, or may be partially or totally absorbed into the SiN layer 13 located under the $Cr_2O_3$ film 35, or may partially or totally remain intact. In the case where the $Cr_2O_3$ film 35 is absorbed into the $Al_2O_3$ film 36 located on the $Cr_2O_3$ film 35, the absorbed $Cr_2O_3$ film 35 serves to stabilize the α-phase $Al_2O_3$ crystalline structure. In the case where the $Cr_2O_3$ film 35 is absorbed into the SiN film 13 located under the $Cr_2O_3$ film 35, the absorbed $Cr_2O_3$ film 35 serves to form a layer that is capable of trapping charges with higher efficiency on the SiN film 13. In the case where the $Cr_2O_3$ film 35 remains intact, the existence of the $Cr_2O_3$ film 35 on the SiN film 13 serves to trap charges with higher efficiency.

In this embodiment, the film to be the template is a film made of a trivalent metal oxide of Cr, Ti, Fe, Ga, Co, Ni, or Mn. However, as described in the first embodiment, it is possible to use a metal oxide film containing at least one of the following materials: Cr, Ti, Fe, Ga, Co, Ni, and Mn, which have some other valence.

As described above, in accordance with this embodiment, a nonvolatile semiconductor memory device that includes MONOS memory cells having the highest possible charge trapping efficiency can be obtained.

Fourth Embodiment

Next, a nonvolatile semiconductor memory device in accordance with a fourth embodiment of the present invention is described. The nonvolatile semiconductor memory device of this embodiment is formed in the following manner.

Figure 22:
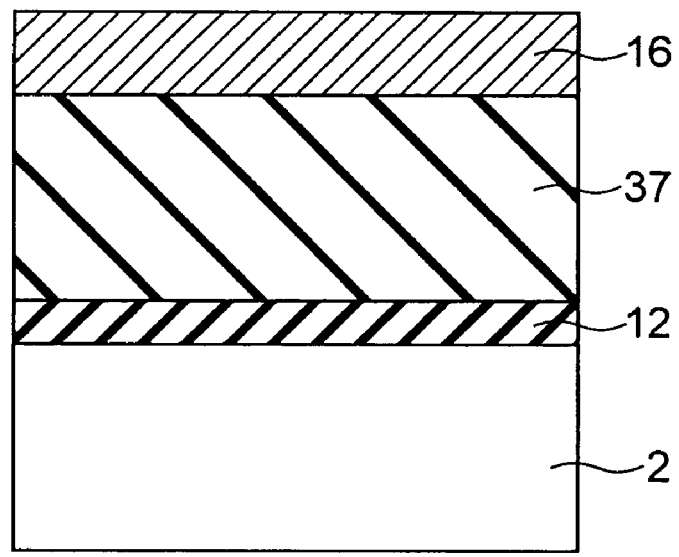
FIG. 22 illustrates a cross-sectional view of a NAND-type MONOS flash memory according to a fourth embodiment.

First, as described in the first embodiment, a tunnel insulating film 12 is formed on a silicon substrate 2, and an $Al_2O_3$ film 37 is then formed (see FIG. 22). Impurity ions are not added to the lower layer of the Al$_2$O$_3$ film 37, but Eu ions are added to the middle layer through ion implantation. Co ions are added to the upper layer through ion implantation. By adding those ions, the impurity concentration in the film thickness direction of the Al$_2$O$_3$ film 37 has the distribution shown in FIG. 23. More specifically, no impurities exist in the lower layer of the Al$_2$O$_3$ film 37, Eu ions are added to the middle layer, and Co ions are added to the upper layer. The ion implantation may be performed after a control gate electrode 16 is formed on the Al$_2$O$_3$ film 37, or may be performed after a dummy film is formed on the Al$_2$O$_3$ film 37 (see FIG. 22). After the Al$_2$O$_3$ film 37 having the additives implanted thereinto and the control gate electrode 16 are formed, the same procedures as those of the first embodiment are carried out, to form a MONOS flash memory of the NAND type. Heat treatment at approximately 1070° C. is carried out in a procedure carried out later than the ion implantation, so that the middle layer turns into a transition alumina layer, and the upper layer turns into an α-phase alumina layer.

Instead of Eu, it is possible to use one or more of the following elements: Pr, Nd, La, Ce, Sm, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu. Instead of Co, it is possible to use one or more of the following elements: Ga, Fe, Ni, Cr, Mn, and Be.

In this embodiment, the middle layer of the Al$_2$O$_3$ film 37 is turned into a transition alumina structure having many electric traps, so that the Al$_2$O$_3$ film 37 can be used as a charge storage film. Accordingly, the formation of the charge storage film 13 made of SiN of the first embodiment can be omitted. As a result, the number of procedures can be reduced by one, and the production costs can be lowered.

Figure 23:
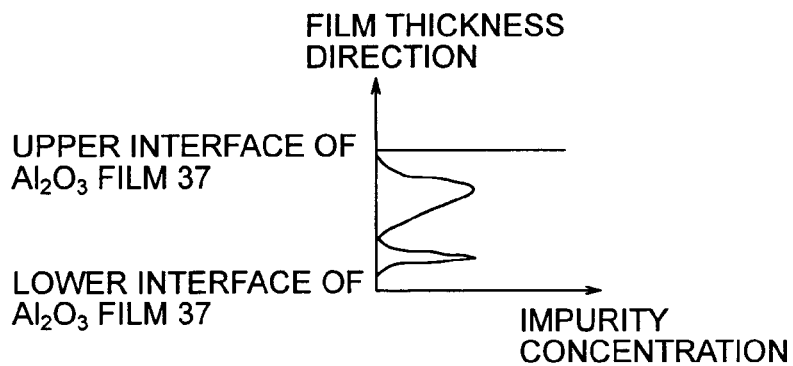
FIG. 23 shows the impurity concentration in the $Al_2O_3$ film of the NAND-type MONOS flash memory according to the fourth embodiment.

In this embodiment, it is essential that an Al$_2$O$_3$ film having no impurity ions added thereto remains in the lower interface of the Al$_2$O$_3$ film 37 existing between the tunnel insulating film 12 and the transition alumina layer (see FIG. 23). This is because, if the Al$_2$O$_3$ film having no impurity ions added thereto does not exist in the lower interface of the Al$_2$O$_3$ film 37 existing between the tunnel insulating film 12 and the transition alumina layer, the impurity reacts with the tunnel insulating film 12 at the time of heat treatment, and the characteristics of the tunnel insulating film 12 are degraded.

As described above, in accordance with this embodiment, a nonvolatile semiconductor memory device that includes MONOS memory cells having the highest possible charge trapping efficiency can be obtained.

Fifth Embodiment

Next, a nonvolatile semiconductor memory device in accordance with a fifth embodiment of the present invention is described. The nonvolatile semiconductor memory device of this embodiment is formed in the following manner.

Figure 24:
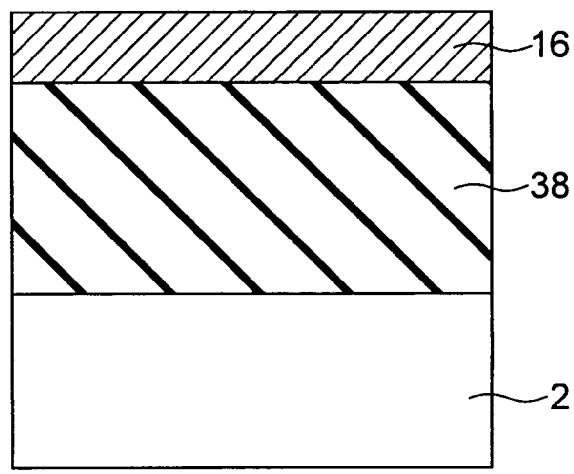
FIG. 24 illustrates a cross-sectional view of a NAND-type MONOS flash memory according to a fifth embodiment.
Figure 25:
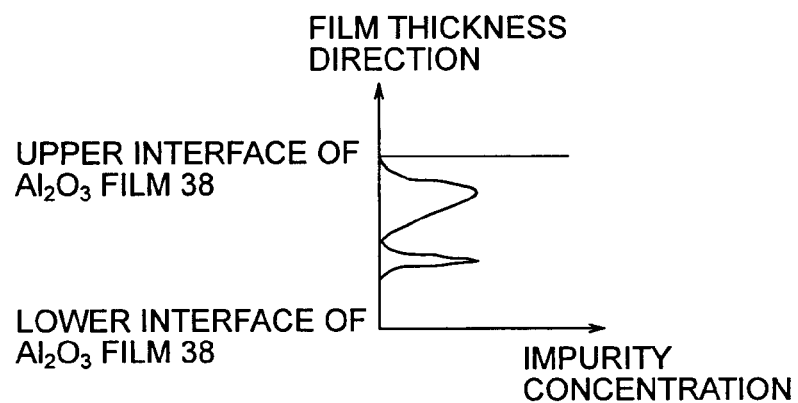
FIG. 25 shows the impurity concentration in the $Al_2O_3$ film of the NAND-type MONOS flash memory according to the fifth embodiment.

First, an Al$_2$O$_3$ film 38 is formed on a silicon substrate 2 having a natural oxide film removed through diluted hydrofluoric acid treatment (see FIG. 24). Impurity ions are not added to the lower layer of the Al$_2$O$_3$ film 38, but Gd ions are added to the middle layer through ion implantation. Also, Mn ions are added to the upper layer through ion implantation. By adding those ions, the impurity concentration in the film thickness direction of the Al$_2$O$_3$ film 38 has the distribution shown in FIG. 25. More specifically, no impurities exist in the lower layer of the Al$_2$O$_3$ film 38, Gd ions are added to the middle layer, and Mn ions are added to the upper layer. The ion implantation may be performed after a control gate electrode 16 is formed on the Al$_2$O$_3$ film 38, or may be performed after a dummy film is formed on the Al$_2$O$_3$ film 38 (see FIG. 24). After the Al$_2$O$_3$ film 38 having the additives implanted thereinto and the control gate electrode 16 are formed, the same procedures as those of the first embodiment are carried out, to form a MONOS flash memory of the NAND type. Heat treatment at approximately 1090° C. is carried out in a procedure carried out later than the ion implantation, so that the middle layer turns into a transition alumina layer, and the upper layer turns into an α-phase alumina layer.

Instead of Gd, it is possible to use one or more of the following elements: Eu, Pr, Nd, La, Ce, Sm, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu. Instead of Mn, it is possible to use one or more of the following elements: Ga, Fe, Ni, Co, Cr, and Be.

By utilizing the structure and the manufacturing method in accordance with this embodiment, the lower layer of the Al$_2$O$_3$ film 38 can serve as a tunnel insulating film having an α-phase alumina structure, the middle layer can serve as a charge storage film having a transition alumina structure, and the upper layer can serve as an electric insulating film having an α-phase alumina structure.

As described above, in accordance with this embodiment, a nonvolatile semiconductor memory device that includes MONOS memory cells having the highest possible charge trapping efficiency can be obtained.

Sixth Embodiment

Figure 26:
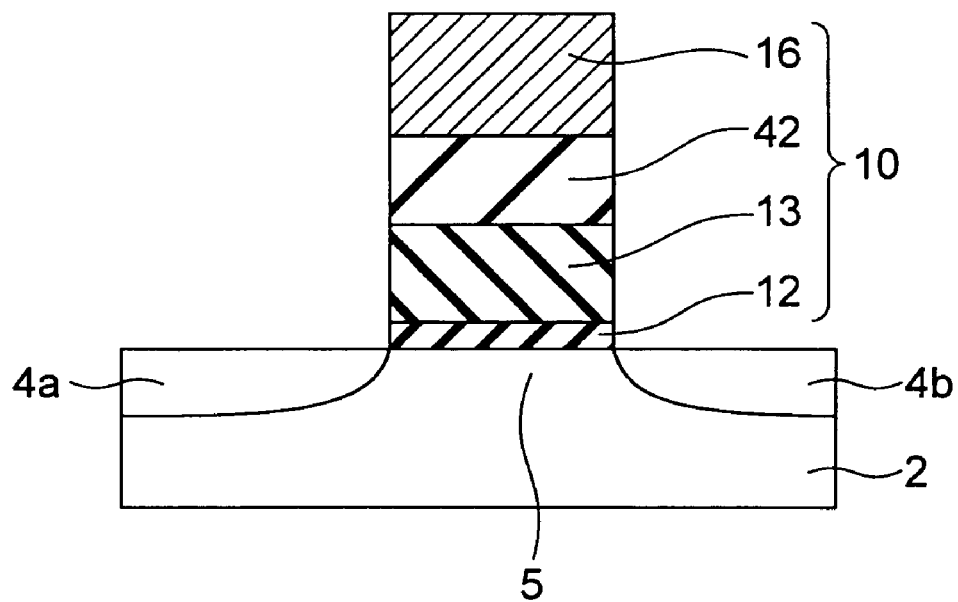
FIG. 26 illustrates a cross-sectional view of a nonvolatile semiconductor memory device according to a sixth embodiment.

Referring now to FIG. 26, a nonvolatile semiconductor memory device in accordance with a sixth embodiment of the present invention is described. The nonvolatile semiconductor memory device of this embodiment includes a NAND cell having memory cells connected in series. Each of the memory cells includes a source region 4a and a drain region 4b formed at a distance from each other so as to face a semiconductor substrate 2 (or a well), and a gate 10 having a stack structure formed on the portion of the semiconductor region serving as a channel 5 between the source region 4a and the drain region 4b. This gate has a structure in which a tunnel insulating film 12, a charge storage film 13, a block insulating film 42, and a control gate electrode film 16 are stacked in this order on the channel 5.

Next, the method for manufacturing this gate 10 is described. First, the tunnel insulating film 12 having an effective oxide thickness (EOT) of 4 nm to 7 nm is formed on the silicon substrate 2 subjected to diluted hydrofluoric acid treatment. Although SiO$_2$ or SiON is preferred as the tunnel insulating film 12, it is possible to use an insulating film having a higher dielectric constant than that of SiO$_2$ of LaAlO$_3$ or the like.

The charge storage film 13 having an EOT in the range of 1.5 nm to 4 nm is formed on the tunnel insulating film 12. SiN film is preferred as the charge storage film, and the most preferred composition of the SiN film is Si$_3$N$_4$. However, it is possible to use HfAlO, and it is also possible to use a charge storage film having a stack structure of a SiN layer, an Al$_2$O$_3$ layer, and a SiN layer.

Next, an Al$_2$O$_3$ film that has an EOT of 2 nm to 5 nm and has Co added thereto is formed as the block insulating film 42 on the charge storage film 13. The film forming method utilized here may be CVD, ALD or a method involving CVD, or PVD. Other than Co, it is possible to add one or more of the following elements to the Al$_2$O$_3$ film: Ni, Fe, Cr, Mn, Ga, and Be. The common feature of those elements is that the octa-coordinate ion radius is greater than 53 pm but smaller than 63 pm.

The control gate electrode 16 is then formed on the block insulating film 42 in the same manner as that described in the foregoing embodiments. Thus, a MONOS flash memory is obtained.

In the structure of this embodiment, the block insulating film 42 has an α-phase alumina structure with an $Al_2O_3$ film of more minute crystalline structure than that of a conventional $Al_2O_3$ film having no impurity ions added thereto. Furthermore, the block insulating film 42 has a large coherent length of the in-film minute structure in the α-phase alumina structure, and has few electric defects. Accordingly, the EOT can be smaller than in a conventional MONOS flash memory having an $Al_2O_3$ film as the block insulating film. Thus, the operating voltage is reduced, and the device size can be made smaller.

As described above, in accordance with this embodiment, a nonvolatile semiconductor memory device that includes MONOS memory cells having the highest possible charge trapping efficiency can be obtained.

It should be noted that all the film thicknesses mentioned in this embodiment are merely examples of appropriate film thicknesses, and the desired effects of the present invention can be achieved even if a film thickness is outside the film thickness range. The block insulating film of the sixth embodiment is a single-layer film made of added alumina. However, it is possible to use a stack structure of a block insulating film and another insulating film causing low leakage current.

Seventh Embodiment

Figure 27:
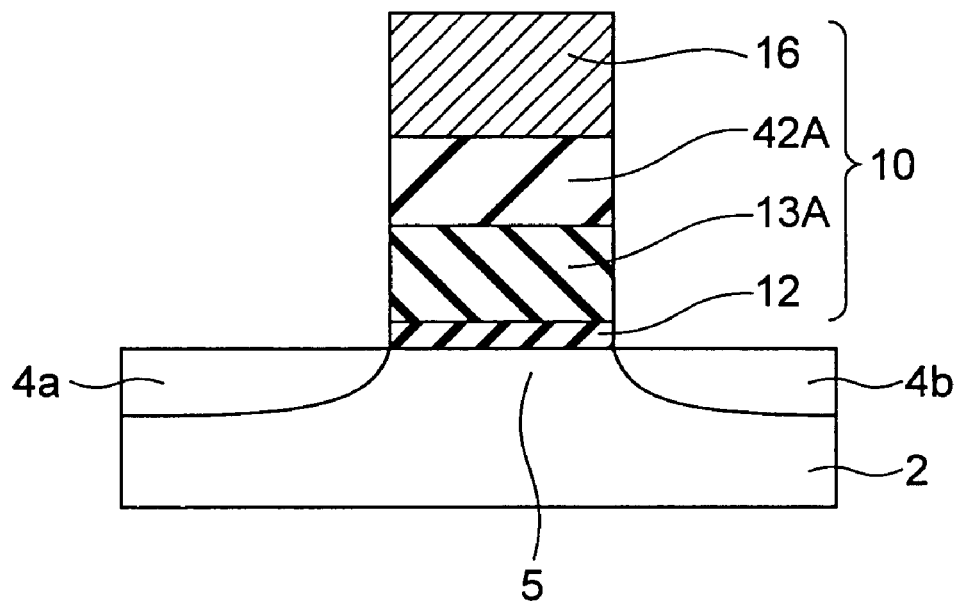
FIG. 27 illustrates a cross-sectional view of a nonvolatile semiconductor memory device according to a seventh embodiment.

Referring now to FIG. 27, a nonvolatile semiconductor memory device in accordance with a seventh embodiment of the present invention is described. The nonvolatile semiconductor memory device of this embodiment has the same structure as that of the sixth embodiment shown in FIG. 26, except that the charge storage film 13 is replaced with a charge storage film 13A, and the block insulating film 42 is replaced with a block insulating film 42A. In this embodiment, an $Al_2O_3$ film having Tb added thereto is used as the charge storage film 13A, and an $Al_2O_3$ film having no impurity ions added thereto is used as the block insulating film 42A.

A method for manufacturing a memory cell in accordance with this embodiment is now described.

First, the tunnel insulating film 12 having an EOT of 4 nm to 7 nm is formed on the silicon substrate 2 subjected to diluted hydrofluoric acid treatment. Although $SiO_2$ or SiON is preferred as the tunnel insulating film 12, it is possible to use an insulating film having a higher dielectric constant than that of $SiO_2$ of $La_2Hf_2O_7$ or the like.

An $Al_2O_3$ film 13A that has an EOT in the range of 1.5 nm to 4 nm and has Tb added thereto is formed as the charge storage film 13A on the tunnel insulating film 12. Instead of Tb, it is possible to use one or more of the following elements: Gd, Eu, Pr, Nd, La, Ce, Sm, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, S, Os, Ir, Pt, Ru, Rh, Pd, Ag, and Cu. The common feature of those elements is that the octacoordinate ion radius is 63 pm or greater, which is at least 1.19 times greater than the octacoordinate ion radius of Al as cation ions.

The block insulating film 42A that has an EOT of 2 nm to 5 nm and is formed with an $Al_2O_3$ film having no impurity ions added thereto is formed on the charge storage film 13. Instead of the $Al_2O_3$ film, it is possible to use a $SiO_2$ film, a SiON film, a HfAlO film, a $LaAlO_3$ film, a $La_2Hf_2O_7$ film, or the like.

The control gate electrode 16 is then formed on the block insulating film 42A.

With this structure, the relative permittivity of the charge storage film 13A can be made higher than the relative permittivity of a SiN film as a conventional charge storage film in a MONOS memory. Because of this, the charge shielding effect is achieved. Accordingly, higher charge storage density can be expected, and high-speed charge trapping characteristics and high-speed erase characteristics can also be expected, as a storage film having high ionicity is employed. In other words, a charge storage film having a small EOT can be formed, and the operating voltage can be made lower than the operation voltage in conventional cases. Since the high-speed charge trapping characteristics and the high-speed erase characteristics are achieved, the operating speed of the memory can be increased.

It should be noted that all the film thicknesses mentioned in this embodiment are merely examples of appropriate film thicknesses, and the desired effects of the present invention can be achieved even if a film thickness is outside the film thickness range as described in the film thickness of the other embodiment. A single-layer film formed with added alumina is used as the charge storage film in the seventh embodiment. However, it is possible to use a stack structure of the single-layer film and another insulating film having a charge storage effect.

In the first through seventh embodiments, NAND flash memories containing memory cells each having a gate with a MONOS structure. However, such a gate with a MONOS structure can be used not only for a NAND flash memory but also for a NOR flash memory. The gate having a MONOS structure can also be used for a DINOR flash memory having a lesser known structure, a 3-transistor NAND cell having one memory interposed between two select transistors, a D-type NAND cell not having the source/drain diffusion layers, or the like.

It should be noted that "MONOS" means the stacked layers of metal, oxide, nitride, oxide, and silicon in a restricted sense, and a film made of a nitride that is not a metal but an insulator is used as the charge storage layer. In a broad sense, "MONOS" involves an insulator that may not be a nitride as the charge storage layer. In the present invention, "MONOS" is used in the broad sense.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory device comprising
   a memory cell, the memory cell including:
       a source region and a drain region formed at a distance from each other in a semiconductor substrate;
       a tunnel insulating film formed on the semiconductor substrate between the source region and the drain region;
       a charge storage film formed on the tunnel insulating film;
       a first alumina layer formed on the charge storage film, and having a first impurity element added thereto, the first impurity element having an octacoordinate ion radius of 63 pm or greater, the first impurity element having a concentration distribution in a layer thickness direction of the first alumina layer that becomes the largest in a region close to the side of the charge storage film;

a second alumina layer formed on the first alumina layer, and not having the first impurity element added thereto; and a control gate electrode formed on the second alumina layer.

2. The memory device according to claim 1, wherein the first impurity element is at least one of Pr, La, Ce, Nd, Sm, Eu, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu.

3. The memory device according to claim 1, wherein a second impurity element having an octacoordinate ion radius that is greater than 53 pm but smaller than 63 pm is added to the second alumina layer.

4. The memory device according to claim 3, wherein the second impurity element is at least one of Ga, Co, Ni, Fe, Cr, Mn, and Be.

5. The memory device according to claim 3, wherein the first impurity element is added to the charge storage film.

6. A nonvolatile semiconductor memory device comprising a memory cell, the memory cell including:

a source region and a drain region formed at a distance from each other in a semiconductor substrate;

a tunnel insulating film formed on the semiconductor substrate between the source region and the drain region;

a charge storage film formed on the tunnel insulating film;

a control gate electrode formed above the charge storage film; and an alumina film formed between the charge storage film and the control gate electrode, and including a transition alumina layer provided on the side of the charge storage film and an α-phase alumina layer provided on the side of the control gate electrode.

7. The memory device according to claim 6, wherein an oxide film containing at least one of Cr, Ti, Fe, Ga, Co, Ni, and Mn exists between the charge storage film and the transition alumina layer.

8. The memory device according to claim 6, wherein the charge storage film is an alumina film not having an impurity element added thereto.

9. The memory device according to claim 6, wherein an alumina layer not having an impurity element added thereto exists between the charge storage film and the transition alumina layer.

10. The memory device according to claim 6, wherein the tunnel insulating film is an alumina layer not having an impurity element added thereto, and the charge storage film is a transition alumina.

11. The memory device according to claim 6, wherein the transition alumina layer contains at least one of Pr, La, Ce, Nd, Sm, Eu, Gd, Tb, Dy, Ho, Er, Tm, Yb, Lu, Y, Sc, In, Hf, Zr, Ti, Pb, Sn, Si, Ta, Nb, V, W, Mo, Ba, Sr, Ca, Mg, Cd, Zn, Bi, Sb, As, N, Te, Se, S, Os, Ir, Pt, Ru, Rh, Pd, Ag, and Cu.

12. The memory device according to claim 6, wherein the α-phase alumina layer contains at least one of Ga, Co, Ni, Fe, Cr, Mn, and Be.

* * * * *